US 6,502,145 B1

(12) United States Patent
Ooishi

(10) Patent No.: US 6,502,145 B1
(45) Date of Patent: *Dec. 31, 2002

(54) SEMICONDUCTOR MEMORY WITH APPLICATION OF PREDETERMINED POWER LINE POTENTIALS

(75) Inventor: Tsukasa Ooishi, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/609,934

(22) Filed: Jun. 30, 2000

Related U.S. Application Data

(62) Division of application No. 08/917,858, filed on Aug. 27, 1997, now Pat. No. 6,134,611.

(30) Foreign Application Priority Data

Mar. 27, 1997 (JP) ............................................. 9-075685

(51) Int. Cl.$^7$ ........................... G06F 13/14; G06F 13/16
(52) U.S. Cl. ........................... 710/22; 710/23; 711/105; 365/145; 365/203; 365/210
(58) Field of Search .................. 710/22, 23; 711/105; 365/145, 210, 203

(56) References Cited

U.S. PATENT DOCUMENTS

| | | | |
|---|---|---|---|
| 4,744,078 A | | 5/1988 | Kowalczyk |
| 4,994,688 A | | 2/1991 | Horiguchi et al. |
| 5,079,762 A | | 1/1992 | Tanaba |
| 5,163,132 A | | 11/1992 | DuLac et al. |
| 5,337,270 A | * | 8/1994 | Kawata et al. ............... 365/149 |
| 5,414,666 A | | 5/1995 | Kumagai et al. |
| 5,420,839 A | | 5/1995 | Tateishi |
| 5,463,381 A | | 10/1995 | Ryu et al. |
| 5,583,561 A | | 12/1996 | Baker et al. |
| 5,610,550 A | * | 3/1997 | Furutani ....................... 327/543 |
| 5,668,762 A | * | 9/1997 | Suwa ....................... 365/189.11 |
| 5,764,966 A | | 6/1998 | Mote, Jr. |
| 5,819,111 A | | 10/1998 | Davies et al. |

FOREIGN PATENT DOCUMENTS

| JP | 2-245810 | 10/1990 |
|---|---|---|
| JP | 8-186490 | 7/1996 |

OTHER PUBLICATIONS

Toru Shimizu, et al., "A Multimedia 32b Risc Microprocessor with 16mb DRAM", ISSSCC96/Session 13/Microprocessor/Paper FP 13.4, (1996)IEEE, Digest of Technical Papers, pp. 216–217.

Peter Gillingham, et al., "A 768k Embedded DRAM for 1.244Gb/s ATM Switch in a 0.8um Logic Process", ISSCC96/Session 16/Technology Directions: Memory/Paper FP 16.2, (1996) IEEE, Digest of Technical Papers, pp. 262–263.

* cited by examiner

Primary Examiner—Jeffrey Gaffin
Assistant Examiner—Rehana Perveen
(74) Attorney, Agent, or Firm—Oblon, Spivak, McClelland, Maier & Neustadt, P.C.

(57) ABSTRACT

Enhanced is a data processing efficiency of a whole semiconductor integrated circuit. A multiplexer is provided on a main parallel data bus for transferring data between an internal device such as a CPU, a DRAM or the like and an external device. When the CPU cannot accept data from the external device, it sends a busy signal to an interface circuit. The interface circuit receives the busy signal and controls the multiplexer in such a manner that the data to be transmitted to the CPU are transferred to the DRAM. Thus, a data transfer rate of the semiconductor integrated circuit is enhanced.

17 Claims, 15 Drawing Sheets

F I G. 1
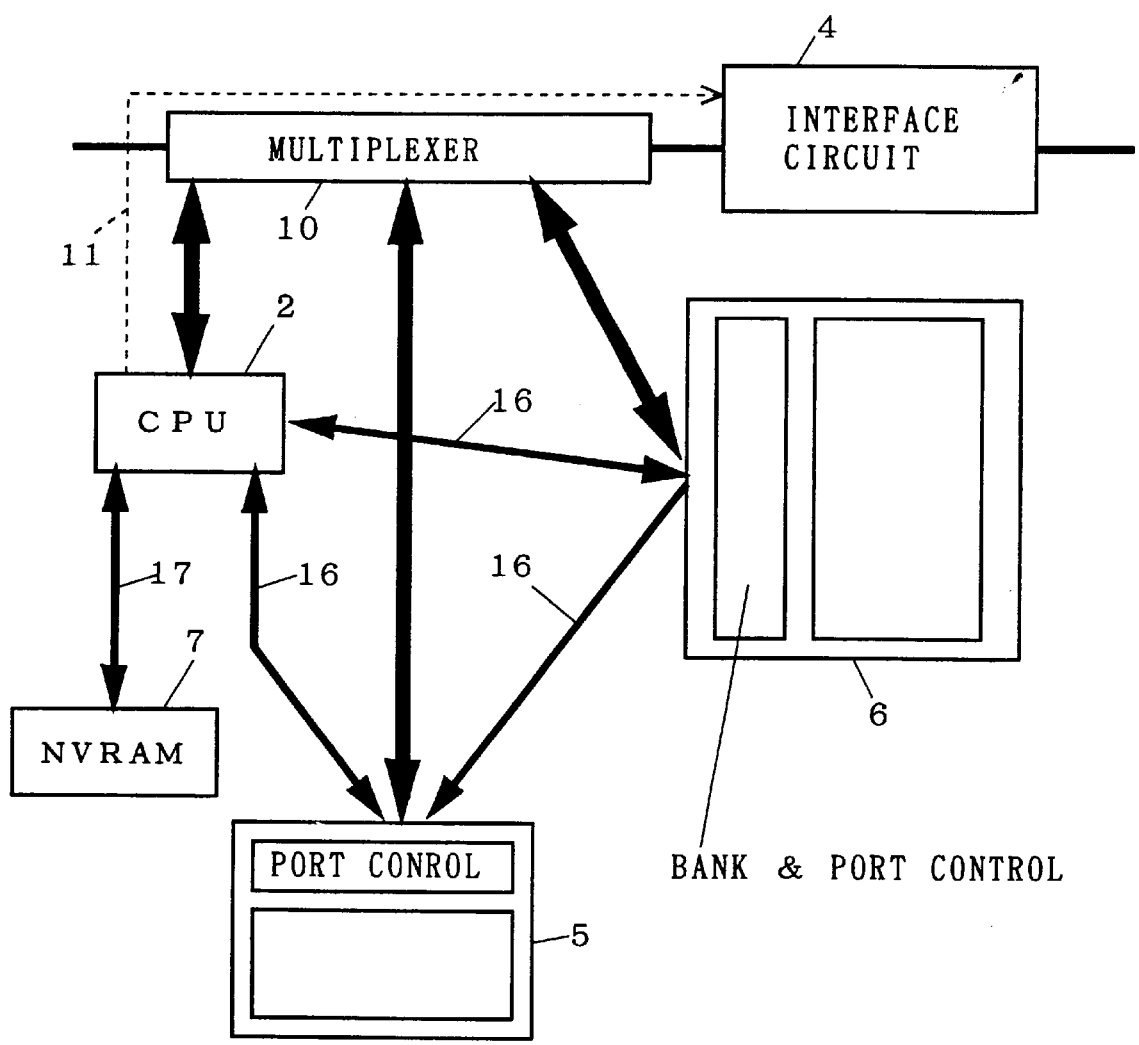

SEMICONDUCTOR MEMORY WITH APPLICATION OF PREDETERMINED POWER LINE POTENTIALS

This application is a Divisional of Ser. No. 08/917,858 filed Aug. 27, 1997 now U.S. Pat. No. 6,134,611.

BACKGROUND OF THE INVENTION

1. Field of the Invention

The present invention relates to a semiconductor integrated circuit, and more particularly to a semiconductor integrated circuit comprising an interface circuit for receiving and sending data from and to an external device connected to an outside of the semiconductor integrated circuit and a bus for transmitting the data from the interface circuit into the semiconductor integrated circuit, a semiconductor integrated circuit comprising a phase-locked loop (hereinafter referred to as a PLL circuit) for synchronizing an internal clock with an external clock at a high speed, and a semiconductor integrated circuit comprising a DRAM which is small-sized and can easily be tested.

2. Description of the Background Art

In a semiconductor integrated circuit, generally, one chip has a plurality of functions. In other words, a plurality of internal devices having different functions are integrated into the same chip so that the semiconductor integrated circuit is formed. FIG. 15 is a block diagram showing a structure of a semiconductor integrated circuit which is a so-called one-chip microcomputer. The one-chip microcomputer is also formed with a plurality of internal devices provided on one chip 1. On the chip 1 is provided a CPU 2 which includes a control circuit for interpreting and executing instructions and serves to perform arithmetic operation. Data such as instructions sent to the CPU 2 are given from internal and external devices provided on the inside and outside of the semiconductor integrated circuit, respectively. The external device is connected to an input-output pin 3. An interface circuit 4 acting as one of the internal devices is connected to the input-output pin 3. The interface circuit 4 serves to electrically and functionally match data transfer between the external device connected to the input-output pin 3 and the internal device of the semiconductor integrated circuit. More specifically, the interface circuit 4 controls data transfer on a boundary between the inside and outside of the semiconductor integrated circuit.

In order for the CPU 2 to execute instructions, the semiconductor integrated circuit should fetch data necessary for the CPU 2. A processing speed of the CPU 2 is limited. Therefore, data generated in the semiconductor integrated circuit and data given from the outside should be held by any internal device until the CPU 2 starts a processing. In order to efficiently transmit data from the internal device such as the CPU 2 to the external device, it is also necessary to hold the data temporarily. In general, a storage is provided in the semiconductor integrated circuit in order to hold data to be processed by the CPU 2 or data waiting to be processed by the CPU 2 and output to the outside. Examples of the storage provided in the semiconductor integrated circuit include a SRAM 5 for sending and receiving data at a maximum speed together with the CPU 2, a DRAM 6 acting as a main memory for storing large scale data required by the CPU 2 and for holding and storing image data and the like when performing an image processing, and a NVRAM 7 for storing a basic program and data and for storing individual programs necessary for application.

The above-mentioned internal devices include the storage such as the SRAM 5 and the CPU 2 in addition to the interface circuit 4. In thecase where plural kinds of internal devices other than the interface circuit 4 are provided, the semiconductor integrated circuit can employ an indirect control method in which two or more channels such as a channel for transferring data between the external device and the CPU 2 and a channel for transferring data between the external device and the storage are provided and the interface circuit 4 is caused to switch channels. Furthermore, the semiconductor integrated circuit can also employ a direct control method for directly inputting data from the external device to the CPU 2 and transferring the same data from the CPU 2 to the storage. In the indirect control method, a selector channel and a multiplex channel are used. The selector channel serves to transfer data at a time without breaking a physical connecting relationship between the channel and the interface circuit 4 until data transfer is completed. The multiplex channel serves to transfer data while switching the physical connecting relationship between the channel and the interface circuit 4 on a unit.

Referring to a multi-channel, the interface circuit 4 switches the channels. Therefore, the interface circuit 4 requires information for switching the channels.

In a multi-channel switching method according to the prior art, channels are switched every byte of data or are switched for each block of data by causing the data to have information about channel selection.

Some kinds of data are transmitted. Data which can immediately be executed by the CPU 2 are directly sent to the CPU 2. Data which should be rewritten to a main memory or stored once are transmitted to a storage side such as the DRAM 6. As a matter of course, some data should be transmitted to the CPU 2 and the storage at the same time. Some of the data transmitted to the DRAM 6 are used for a cache. Such data are stored in the SRAM 5 simultaneously.

The data to be processed by the CPU 2 and output from the CPU 2 include data to be exactly output to an external device in addition to data to be transferred to the SRAM 5 and the DRAM 6. In such a case, the prior art can also employ a method for causing the DRAM 6 to store all the data once, connecting the interface circuit 4 to the DRAM 6 by a multiplexer (not shown) and sending only data to be output from the DRAM 6 to the external device. A PLL circuit 8 which is also used in the semiconductor integrated circuit shown in FIG. 15 will be described below. The PLL circuit 8 is provided to synchronize an internal clock used in the semiconductor integrated circuit with an external clock sent from the outside of the semiconductor integrated circuit. Also in a system chip, the PLL circuit is used. Referring to the system chip, a clock is always set to a power down mode, a refresh mode or the like. Also in such a case, it is important to realize high-speed synchronization in order to increase a speed of operation of the semiconductor integrated circuit performed in response to the internal clock. The internal clock should be synchronized with the external clock to perform communication between the external device and the semiconductor integrated circuit.

As shown in FIG. 17, the PLL circuit according to the prior art includes a frequency phase comparator 30 for detecting differences in frequencies and phases, a charge pump 31 for causing a current to flow into or out for a period of time corresponding to a result of the detection performed by the frequency phase comparator 30, a loop filter 32 for eliminating high-frequency components and noises from an output of the charge pump 31 to obtain a DC voltage, and a ring oscillator 33 for generating an internal clock having a frequency corresponding to an output of the loop filter 32. In the PLL circuit according to the prior art, one frequency phase comparator performs two processes, that is, a frequency leading-in process for causing frequencies to approximate to each other in order to synchronize the internal clock with the external clock, and a phase synchronizing process for completing phase synchronization.

The semiconductor integrated circuit according to the prior art has the above-mentioned structure. Therefore, input data always arrives at a predetermined destination, and data transfer is terminated while the data cannot be accepted at the destination until the data can be accepted at the same destination. For this reason, it takes a lot of time to transfer the data As shown in FIG. 15, for example, data having destination information is sent from the external device to the interface circuit 4 through the input-output pin 3. If the CPU 2 indicates the destination information of the data, the interface circuit 4 connects the CPU 2 and the channel to transmit the data through the connected channel. If the CPU 2 is in a busy state of instruction processing or the like and cannot receive the data, the channel cannot be disconnected before data transmission is completed. Consequently, the data cannot be transferred efficiently.

FIG. 16 is a block diagram showing a structure of an expand version of a semiconductor integrated circuit which is more suitable for processing mass data than in FIG. 15. In the semiconductor integrated circuit having the expand version shown in FIG. 16, a chip size is naturally increased and capacities of a SRAM 5 and a DRAM 6 are enlarged. Furthermore, a ROM 9 to store basic programs and the like is provided in addition to a NVRAM 7. In the semiconductor integrated circuit having the expand version which transmits mass data, a transfer efficiency should be prevented from being deteriorated. Such a problem is more serious than in an ordinary semiconductor integrated circuit.

In the case where data is transmitted from an internal device to an external device, all the data necessary for the external device should be transferred to the internal device in advance if a channel connected to the same external device is fixed. Consequently, a local link for connecting the internal devices becomes complicated.

In a semiconductor integrated circuit comprising the PLL circuit according to the prior art, one frequency phase comparator performs the two processes, that is, the frequency leading-in process for causing frequencies to approximate to each other in order to synchronize an internal clock with an external clock and the phase synchronizing process for completing phase synchronization. For this reason, if a frequency leading-in range is set wide, a setting time is increased.

In a semiconductor integrated circuit comprising the DRAM according to the prior art, the DRAM occupies great parts of the area and consumed power. If the DRAM is enlarged, the area and the consumed power of the semiconductor integrated circuit are increased.

A test for the DRAM often requires a technique for simultaneously writing the same data to a plurality of memory cells. In such a case, generally, it has been proposed that a word line is selected and then the data are sequentially written to the memory cells or that a register is provided on a side of a memory cell array and the data are written to the register and then are written to the memory cells in the memory cell array in a batch. In these cases, the DRAM has an overhead of a write cycle during batch write of data for performing the test in a test mode. Therefore, the semiconductor integrated circuit cannot operate at a high speed.

SUMMARY OF THE INVENTION

A first aspect of the present invention is directed to a semiconductor integrated circuit comprising an interface circuit, a multiplexer, first and second internal devices connected to the interface circuit through the multiplexer, respectively, and an internal bus for transmitting data between the first and second internal devices without using the multiplexer, wherein the first internal device outputs a processing signal to the interface circuit if the first internal circuit cannot accept data to be given to the first internal device, which data is input from an external device to the interface circuit, and the interface circuit controls the multiplexer on the basis of the processing signal and transfers, to the second internal device, the data to be given to the first internal device.

A second aspect of the present invention is directed to a semiconductor integrated circuit comprising an interface circuit, a multiplexer, first and second internal devices connected to the interface circuit through the multiplexer, respectively, and an internal bus for transmitting data between the first and second internal devices without using the multiplexer, wherein if there are data to be output from the first internal device to an external device through the interface circuit and data to be output from the second internal device to the external device through the interface circuit, the interface circuit controls the multiplexer according to information about data transfer given from the first internal device to the interface circuit and alternately outputs, to the external device, the data to be output from the first internal device and the data to be output from the second internal device.

A third aspect of the present invention is directed to a phase-locked loop circuit comprising first current output means for dividing a frequency of an external clock by that of an internal clock to calculate a quotient as an integer or an inverse number of the integer and for generating a first current proportional to the quotient, second current output means for generating a second current based on a phase difference between the external clock and the internal clock, and an oscillator for controlling a frequency on the basis of a sum of the first and second currents to generate the internal clock.

A fourth aspect of the present invention is directed to the phase-locked loop circuit according to the third aspect of the present invention, wherein the first current output means has a ring oscillator for shifting a phase of the internal clock synchronously with transition of the external clock, and a half cycle of an output of the ring oscillator is compared with that of the external clock to calculate the quotient.

A fifth aspect of the present invention is directed to the phase-locked loop circuit according to the fourth aspect of the present invention, wherein the second current output means has a bi-directional shift ring formed by connecting, like a ring, a plurality of bi-directional shift registers for performing shift in a direction corresponding to a sign of the phase difference at a shift speed according to the sum of the first and second currents, and the second current is increased or decreased on the basis of the direction of shift of the bi-directional shift ring.

A sixth aspect of the present invention is directed to a semiconductor integrated circuit comprising a word line, first and second bit lines which are paired with each other, at least one of which is selectively connected to a memory cell by the word line, third and fourth bit lines provided corresponding to the first and second bit lines respectively and paired with each other, a first transistor connected between the first and third bit lines in series and on-off controlled in response to a first signal sent to a control electrode, a second transistor connected between the second and fourth bit lines in series and on-off controlled in response to the first signal sent to a control electrode, first and second power lines capable of supplying a first voltage and a second voltage different from the first voltage, and of being cut off from a power supply to be brought into a floating state, a third power line for supplying a third voltage between the first and second voltages, switching means for connecting the third power line to the third and fourth bit lines in response to an equalize signal, a third transistor having a first current electrode connected to the first power line, a second current electrode connected to the third bit line, and a control electrode connected to the fourth bit line, a fourth transistor having a first current electrode connected to the first power line, a second current electrode connected to the fourth bit line, and a control electrode connected to the third bit line, a fifth transistor having a first current electrode connected to the second power line, a second current electrode connected to the third bit line, and a control electrode connected to the second bit line, and a sixth transistor having a first current electrode connected to the second power line, a second current electrode connected to the fourth bit line, and a control electrode connected to the first bit line.

A seventh aspect of the present invention is directed to a semiconductor integrated circuit comprising a first transistor having a first current electrode connected to storage nodes of memory cells, a second current electrode and a control electrode, the first transistor being conducted when the control electrode is at "High" level and being non-conducted when the control electrode is at "Low" level, a word line connected to the control electrode of the first transistor, a first bit line connected to the second current electrode of the first transistor, a second bit line provided corresponding to the first bit line, a second transistor having a first current electrode connected to the first bit line, a second current electrode connected to the second bit line and a control electrode to which a first signal is sent, the second transistor being conducted when the first signal is at the "High" level and being non-conducted when the first signal is at the "Low" level, a power line, a third transistor having a first current electrode connected to the power line, a second current electrode connected to the second bit line and a control electrode to which a second signal is sent, the third transistor being conducted when the second signal is at the "High" level and being non-conducted when the second signal is at the "Low" level, and a negative voltage generating circuit capable of being selectively connected to the power line and supplying, to the power line, a negative voltage which can cause the power line to have a voltage lower than the "Low" level and make the first to third transistors conducted.

An eighth aspect of the present invention is directed to a semiconductor integrated circuit comprising a word line and a first bit line connected to each other through a memory cell, a second bit line provided corresponding to the first bit line, a first transistor having a first current electrode connected to the first bit line, a second current electrode connected to the second bit line, and a control electrode to which a first signal is sent, the first transistor being conducted when the first signal has a first potential and being non-conducted when the first signal has a second potential, a second transistor having a first current electrode connected to the second bit line, a second current electrode and a control electrode to which a second signal is sent, a power line connected to the second current electrode of the second transistor, and a potential generating circuit capable of being selectively connected to the power line and giving, to the power line, a potential different from an intermediate potential between the first and second potentials by a value greater than a threshold value of the second transistor when the second bit line is cut off from the first bit line by the first transistor so that the second bit line and the second signal have the intermediate potential.

According to the first aspect of the present invention, also in the case where the first internal device cannot accept data, the data can be transferred to the second internal device and then given from the second internal device to the first internal device by using the internal bus. Therefore, a data transfer efficiency between the external device and the semiconductor integrated circuit can be enhanced, and the data can be transmitted precisely.

According to the second aspect of the present invention, channels are switched by the multiplexer on the basis of information sent from the first internal device, and the data output from the first internal device and the data output from the second internal device are linked together to form a series of data. Consequently, data transfer between the first and second internal devices can be omitted. Thus, a data processing rate can be enhanced.

According to the third aspect of the present invention, a ratio of a frequency of the external dock to that of the internal clock can range from ½ to 2 by the first current. Therefore, a phase difference comparison for setting a second current can be performed quickly. Consequently, a speed at which the internal clock is lead into the external clock can be enhanced.

According to the fourth aspect of the present invention, it is easy to calculate the ratio of the frequency of the external clock to that of the internal clock as an integer or an inverse number of the integer.

According to the fifth aspect of the present invention, the bi-directional shift ring is used, a shift speed of which is controlled depending on a frequency. Therefore, high precision can be kept with a high frequency.

According to the sixth aspect of the present invention, the third and fourth transistors can be used as an amplifier of a sense amplifier and a latch. Therefore, a size of the semiconductor integrated circuit can be reduced correspondingly.

According to the seventh aspect of the present invention, batch writing is performed with a negative voltage. Consequently, an overhead of a write cycle is eliminated so that the semiconductor integrated circuit can operate at a higher speed.

According to the eighth aspect of the present invention, when the bit line has a precharge potential, data can be written to memory cells connected to an intended word line in a batch by causing the bit line to have a high or low potential.

In order to solve the above-mentioned problems, it is an object of the present invention to cause an interface circuit to have a function of changing a destination according to information given from an internal device to the interface circuit and to transfer data to other internal devices when an internal device to which the data should be transmitted cannot receive the data, thus reducing an average time in which the interface circuit is connected to a channel every unit quantity of the data.

It is another object of the present invention to synchronize an external clock with an internal clock even if a frequency is greatly changed and to reduce a time for the synchronization, thus increasing an operating speed of a semiconductor integrated circuit.

It is yet another object of the present invention to reduce a size of the semiconductor integrated circuit by simplifying a DRAM.

It is a further object of the present invention to reduce a test time for the DRAM and to increase the operating speed of the semiconductor integrated circuit by eliminating an overhead of a write cycle during batch write of test data to the DRAM.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing an example of a structure of a semiconductor integrated circuit according to a first embodiment of the present invention;

DESCRIPTION OF THE PREFERRED EMBODIMENTS

First Embodiment

Figure 2:
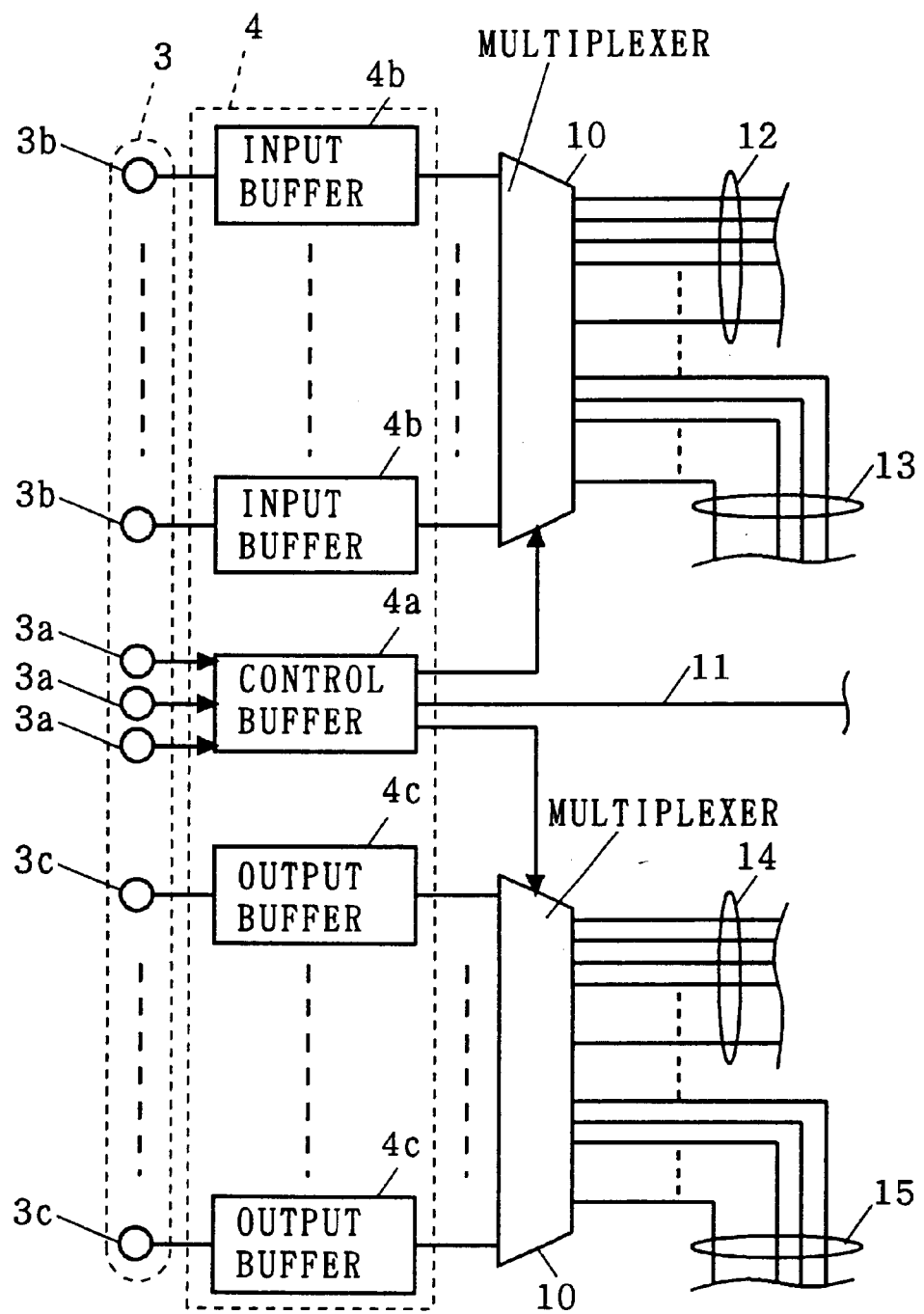
FIG. 2 is a block diagram showing a relationship between a multiplexer and an interface circuit in FIG. 1.

A semiconductor integrated circuit according to a first embodiment of the present invention will be described below with reference to FIGS. 1 and 2.

FIG. 1 is a block diagram showing an example of a relationship between internal devices of the semiconductor integrated circuit and buses connected to them.

In the semiconductor integrated circuit shown in FIG. 1, a multiplexer 10 forming a main parallel data bus is connected to a CPU 2, an interface circuit 4, a SRAM 5 and a DRAM 6 in parallel.

The multiplexer 10 is controlled by the interface circuit 4. By the multiplexer 10, the CPU 2, the SRAM 5 and the DRAM 6 are selectively connected to the interface circuit 4, and data is transmitted between one internal device connected to the interface circuit 4 and an external device. For example, when the CPU 2 is selected by the multiplexer 10, it transmits the data together with the external device through the interface circuit 4.

The case where data is transmitted from the external device to the CPU 2 will be described below. If the CPU 2 is viewed from the external device in respect of data transmission, there are two states. In one of the states, the CPU 2 can receive data. In the other state, the CPU 2 cannot receive data. In the case where the CPU 2 can receive the data, the interface circuit 4 controls the multiplexer 10 on the basis of destination information toward the CPU 2 to open a channel toward the CPU 2 if the external device sends data having the same information to the interface circuit 4. Thus, data transmission can be performed immediately.

In the case where the CPU 2 cannot receive the data, the multiplexer 10 cannot open a channel between another internal device and the external device when the interface circuit 4 opens the channel toward the CPU 2. Therefore, a processing signal such as a busy signal 11 indicating that the data cannot be received is sent from the CPU 2 to the interface circuit 4 in such a manner that the channel toward the CPU 2 is not opened FIG. 2 is a block diagram showing a relationship between the interface circuit 4 and the multiplexer 10. An input-output pin 3 includes a control pin 3a to which a control signal is input from the external device, an input pin 3b to which an input signal is sent, and an output pin 3c for sending an output signal from the semiconductor integrated circuit to the external device.

A signal input from the input-output pin 3 includes a control signal having destination information to be given to a control buffer 4a of the interface circuit 4 through the control pin 3a. The control buffer 4a controls the multiplexer 10 in response to the control signal. For example, if the data is to be transmitted to the CPU 2, the multiplexer 10 connects an input buffer 4b to a signal line 12 connected to the CPU 2 in response to the control signal output from the control buffer 4a. If the data is to be transmitted to the DRAM 6, a signal line 13 connected to the DRAM 6 is connected to the input buffer 4b in response to the control signal. A signal line leading to the SRAM 5 is also provided which is not shown in FIG. 2, and is connected to the input buffer 4b by the multiplexer 10 in response to the control signal.

Referring to a relationship between the semiconductor integrated circuit and the external device obtained when the CPU 2 is performing a processing and cannot accept data from the external device, the external device is in the state of waiting to transmit data to the semiconductor integrated circuit. Consequently, the processing of the semiconductor integrated circuit and the external device do not progress. If the CPU 2 is waited to complete the processing and the data is transferred from the external device, an efficiency of data transfer to the semiconductor integrated circuit is decreased. Therefore, the CPU 2 sends the busy signal 11 to the control buffer 4a of the interface circuit 4 when it is performing the processing and cannot accept the data. The control buffer 4a receives the busy signal 11 to change a destination of the data to be transmitted to the CPU 2 in accordance with predetermined rules. For example, the data which is to be sent from the external device to the CPU 2 is transferred to the DRAM 6. Thus, the data transfer efficiency between the semiconductor integrated circuit and the external device can be enhanced.

Similarly, the SRAM 5 and the DRAM 6 have the same relationship. For example, when the SRAM 5 and the CPU 2 communicate with each other and cannot communicate with other devices, data which is to be transmitted from the external device to the SRAM 5 can be transferred to the DRAM 6 by using the interface circuit 4.

When the CPU 2 and the SRAM 5 can accept the data, it is verified whether or not the data to be accepted are stored in the DRAM 6. If any, the CPU 2 and the SRAM 5 accept the data by using a local link bus 16.

The local link bus 16 is provided among three internal devices, that is, the CPU 2, the DRAM 6 and the SRAM 5. By using the local link bus 16, individual data can be transferred therebetween. If the DRAM 6 and the SRAM 5 are changed to have a dual port, two local link buses 16 can simultaneously be used to transfer data to two other internal devices to which the local link buses 16 are separately connected. For example, data to be sent to the CPU 2 and the SRAM 5 which are stored in the DRAM 6 are simultaneously transmitted so that the data transfer efficiency can further be increased. An independent bus 17 connected to NVRAM 7 is opened toward the CPU 2, which is a non-volatile memory.

While the case where the destination of the data is fixed to only one internal device in the interface circuit 4 (selector channel) has been described above, it is also possible to specify a plurality of internal devices as the destination by executing multi-selection (multiplex channel). In this case, when the CPU 2 cannot accept data and the DRAM 6 accepts the data in place of the CPU 2 as described above, the same data and data which should essentially be accepted by the DRAM 6 alternately arrive at the DRAM 6. Accordingly, these data should be stored in the DRAM 6 without confusion. For example, it is necessary to send the busy signal 11 from the CPU 2 to the DRAM 6 and to distribute and store, in a plurality of blocks of a memory area, the data sent to the DRAM 6 while the busy signal 11 is arriving. Even if the data are not distributed, the same effects as in the above-mentioned embodiment can be obtained by taking measures to prevent the confusion of the data on a DRAM 6 side.

The case where data is output from the internal device to the external device will be described below. The data processed by the CPU 2 and output therefrom include data to be exactly output to the external device in addition to the data transferred to the SRAM 5 and the DRAM 6. In such a case, the multiplexer 10 is switched in response to a processing signal such as the busy signal 11 sent from the CPU 2 to the interface circuit 4 so that the data to be directly output from the CPU 2 to the external device and the data to be output from the DRAM 6 to the external device are output as a series of data. For example, the multiplexer 10 first selects channels in response to an instruction sent from the interface circuit 4 so as to open the channel between the CPU 2 and the external device. When the data of the DRAM 6 is to be output subsequently to the data output of the CPU 2, the busy signal 11 is sent from the CPU 2 to the interface circuit 4 so as to cause the multiplexer 10 to switch the channel. Thus, the data of the DRAM 6 is output to the external device subsequently to the data of the CPU 2. When the data is to be output from the CPU 2, information is transmitted from the DRAM 6 to the CPU 2. Consequently, the CPU 2 stops outputting the busy signal 11 so that the channel between the CPU 2 and the external device is opened by the multiplexer 10. By repeating such operation, a series of data can be output from two internal devices such as the CPU 2 and the DRAM 6 to the external device.

In the case where a series of data obtained by linking the data of the internal devices together are to be output to one external device at a time, it is sufficient that the required internal devices are selected alternately by the multiplexer 10. Since a step of collecting these data into one internal device can be omitted, a burden of the local link bus 16 can be lessened correspondingly. In addition, a time taken to collect the data into the internal device can be shortened. Consequently, a data processing rate of the semiconductor integrated circuit can be enhanced.

Figure 3:
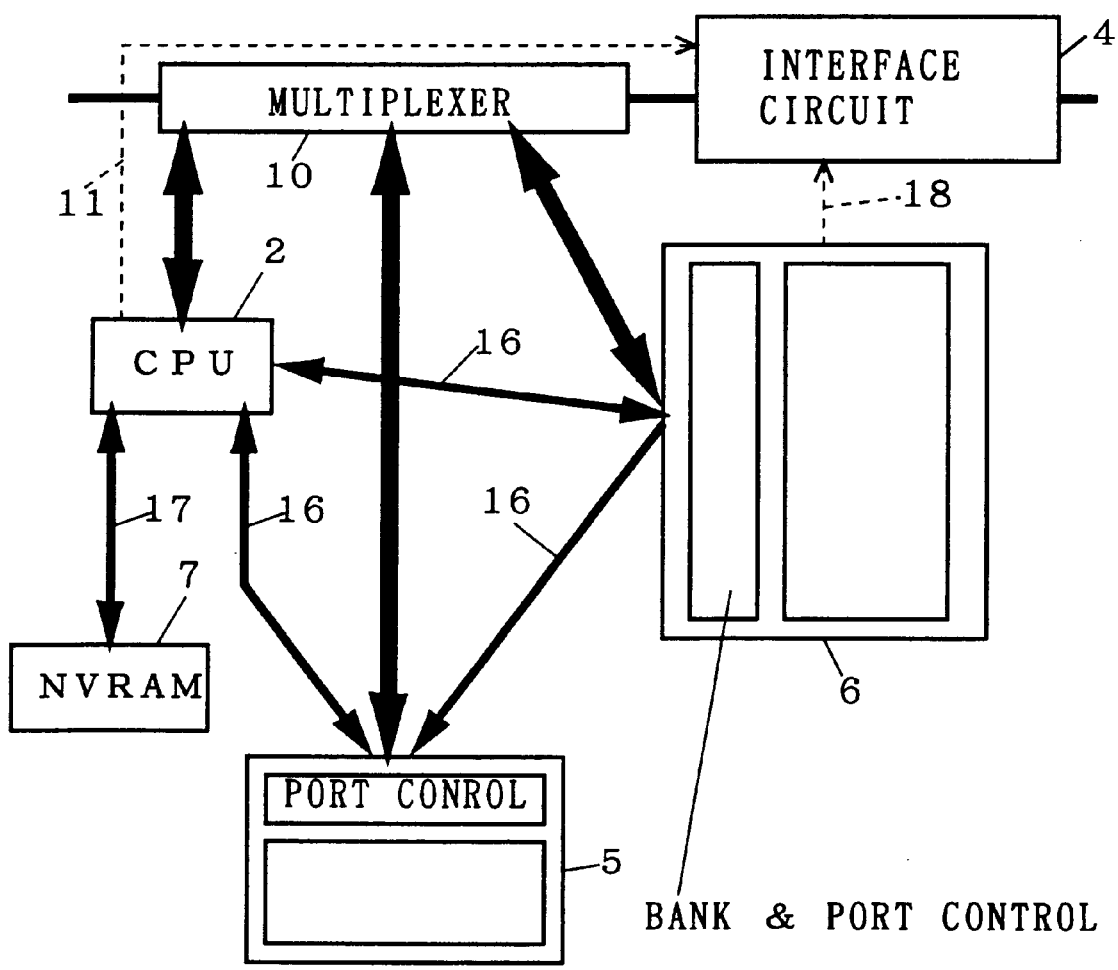
FIG. 3 is a block diagram showing another example of the structure of the semiconductor integrated circuit according to the first embodiment of the present invention.

While the busy signal 11 is output from only the CPU 2 to the interface circuit 4 in the above-mentioned embodiment, it may be output from another internal device such as the DRAM 6 or from a plurality of internal devices as shown in FIG. 3 to obtain the same effects as in the above-mentioned embodiment.

Second Embodiment

Figure 4:
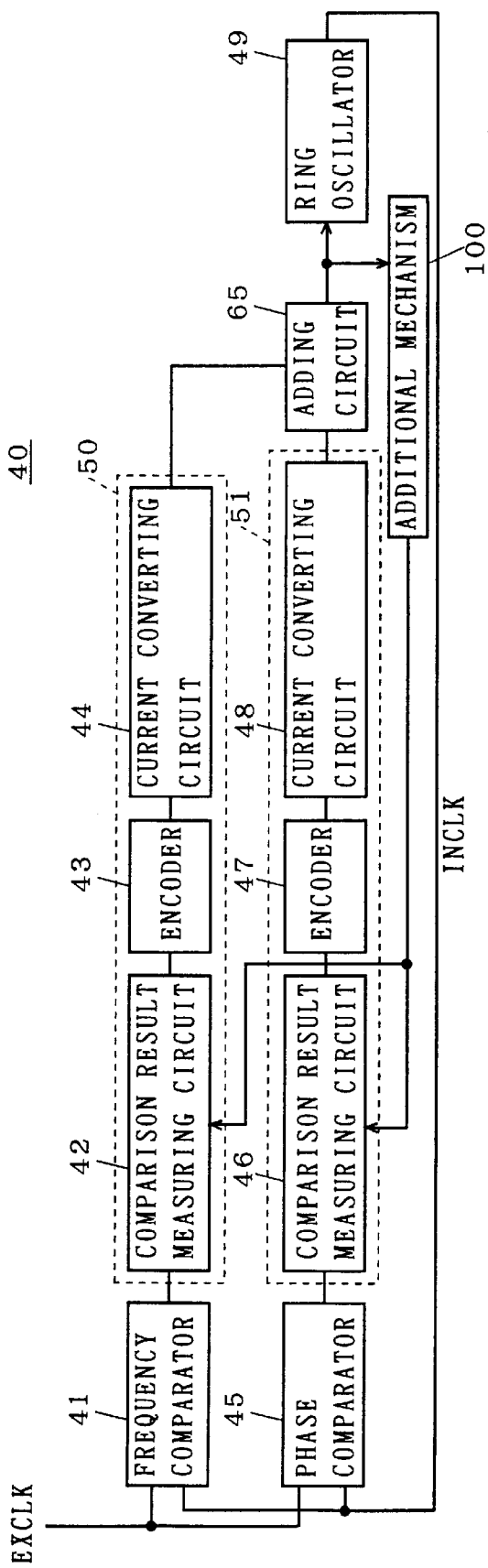
FIG. 4 is a block diagram showing an example of a structure of a semiconductor integrated circuit according to a second embodiment of the present invention.

FIG. 4 is a block diagram showing a structure of a PLL circuit according to a second embodiment of the present invention. In a PLL circuit 40 shown in FIG. 4, a frequency comparator 41 compares a frequency of an external clock EXCLK with that of an internal clock INCLK, and a phase comparator 45 compares a phase of the external clock EXCLK with that of the internal clock INCLK simultaneously with the comparison performed by the frequency comparator 41.

First current output means 50 outputs a current corresponding to a result of the comparison performed by the frequency comparator 41. Second current output means 51 outputs a current corresponding to a result of the comparison performed by the phase comparator 45. A ring oscillator 49 generates and outputs an internal clock INCLK having a frequency corresponding to a sum of the currents output from the first and second current output means 50 and 51.

In the PLL circuit 40, correction of the internal clock INCLK having a shift of the frequency and that of the internal clock INCLK having a shift of the phase are performed very independently. Therefore, it is possible to reduce a time taken to synchronize the internal clock INCLK with the external clock EXCLK again when they are not synchronized with each other.

The first current output means 50 of the PLL circuit 40 includes a comparison result measuring circuit 42 for counting a ratio of the frequency of the internal clock INCLK output from the frequency comparator 41 to that of the external clock EXCLK, an encoder 43 for encoding a result of output of the comparison result measuring circuit 42, and a current converting circuit 44 for converting a code output from the encoder 43 into a current having a current value corresponding to the code.

The second current output means 51 of the PLL circuit 40 includes a comparison result measuring circuit 46 for performing shift in a direction corresponding to a phase difference of the current external clock EXCIK depending on a difference in the phase between the internal clock INCLK output from the phase comparator 45 and the external clock EXCLK, an encoder 47 for encoding a result of output of the comparison result measuring circuit 46, and a current converting circuit 48 for converting a sign output from the encoder 47 into a current having a current value corresponding to the sign.

Figure 5:
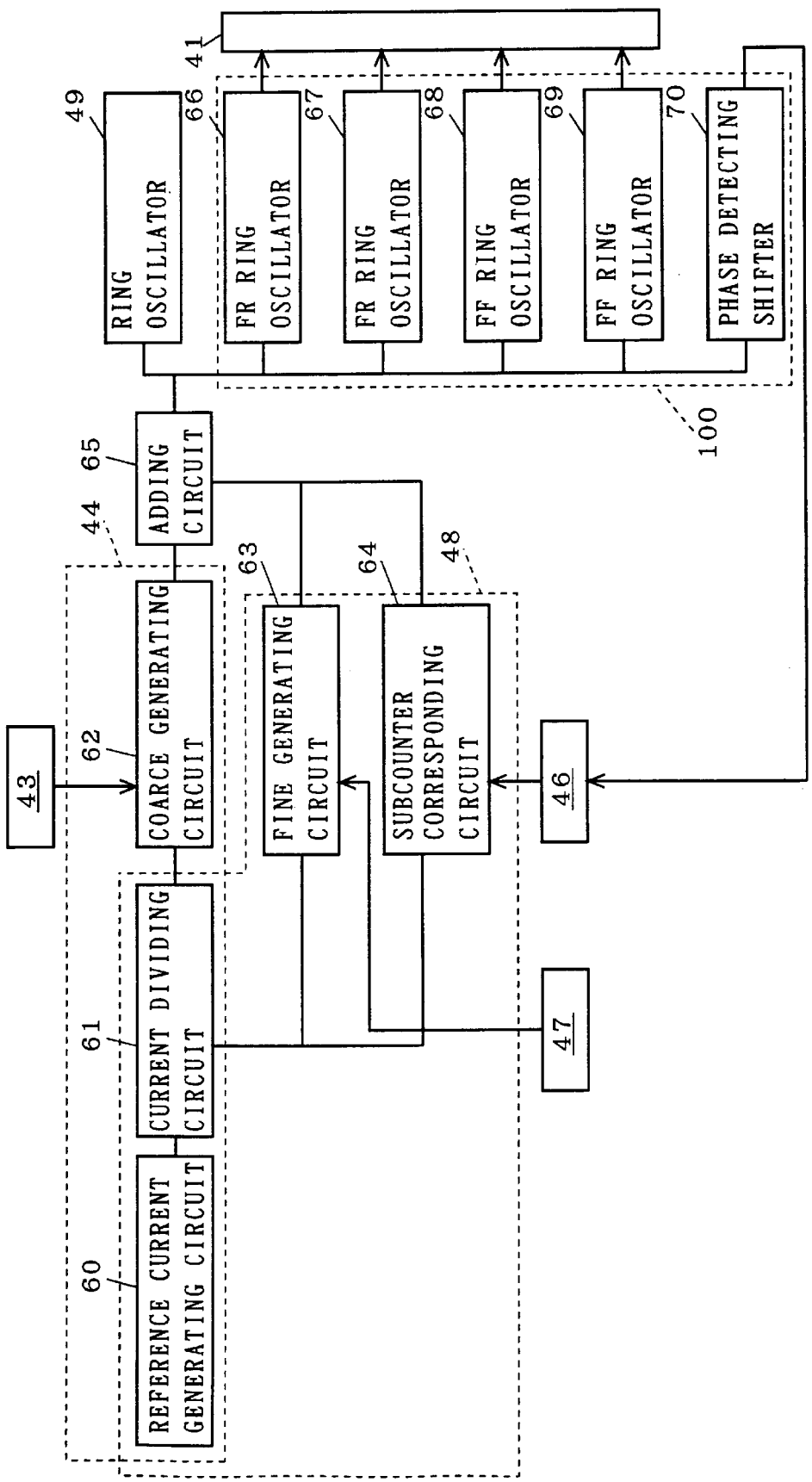
FIG. 5 is a block diagram for explaining two current converting circuits in FIG. 4.

FIG. 5 is a block diagram illustrating current control in the PLL circuit. The current converting circuits 44 and 48 share a reference current generating circuit 60 and a current dividing circuit 61. The reference current generating circuit 60 generates a current corresponding to the internal clock INCLK output from the ring oscillator 49. Accordingly, if the frequencies of the external clock EXCLK and the internal clock INCLK are coincident with each other and are not changed, a reference current is not changed and a frequency of the internal clock INCLK output from the ring oscillator 49 is also constant.

The current dividing circuit 61 supplies the current output from the reference current generating circuit 60 to a Coarce generating circuit 62, a Fine generating circuit 63 and a subcounter corresponding circuit 64 separately at a predetermined ratio. The currents sent to the Fine generating circuit 63 and the subcounter corresponding circuit 64 have the same magnitude, and are not supplied through one current path. However, even if the current is supplied at different ratios, effects of the present invention can be obtained.

The Coarce generating circuit 62 is provided in the current converting circuit 44, and serves to increase, by n times or one nth, the current sent from the current dividing circuit 61 according to the code output from the encoder 43.

The Fine generating circuit 63 is provided in the current converting circuit 48, and serves to increase or decrease the current sent from the current dividing circuit 61 according to the sign output from the encoder 47. In some cases, the Fine generating circuit 63 should increase the current depending on a phase difference. Consequently, only a constant rate of the current preliminarily sent from the current dividing circuit 61 is caused to flow, and an amount of the current to flow is increased if necessary.

The subcounter corresponding circuit 64 is also provided in the current converting circuit 48, and serves to increase or decrease a constant rate of the current sent from the current dividing circuit 61. An adding circuit 65 adds currents output from the Coarce generating circuit 62, the Fine generating circuit 63 and the subcounter corresponding circuit 64.

The ring oscillator 49 outputs an internal clock INCLK having a frequency corresponding to a current output from the adding circuit 65. An additional mechanism 100 includes a first FR ring oscillator 66, a second FR ring oscillator 67, a first FF ring oscillator 68, a second FF ring oscillator 69 and a phase detecting shifter 70, each of which outputs a clock having a frequency corresponding to the current output from the adding circuit 65. The clocks oscillated by the ring oscillators 49 and 66 to 69 have the same frequency.

Figure 7:
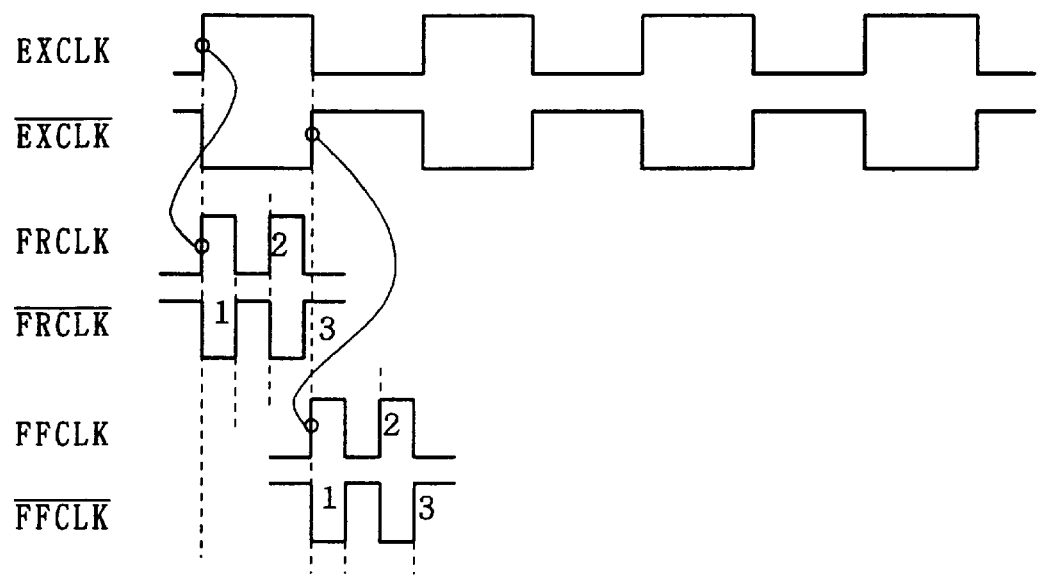
FIGS. 7 and 8 are timing charts for explaining operation of a frequency comparator.

Operation of comparing the frequencies of the external clock EXCLK and the internal clock INCLK by means of the frequency comparator 41 will be described below with reference to FIGS. 7 and 8. FIG. 7 is a timing chart for explaining the case where the frequency of the external clock EXCLK is lower than that of the internal clock INCLK By using a leading edge of the external clock EXCLK as a trigger, the first FR ring oscillator 66 outputs a clock FRCLK having the same frequency as that of the internal clock INCLK and an inverted clock $\overline{\text{FRCLK}}$.

When the external clock EXCLK is at "High" level, leading edges of the clock FRCLK and the clock $\overline{\text{FRCLK}}$ are counted (excluding those corresponding to the leading edge of the external clock EXCLK). In FIG. 7, the total number of the leading edges is three. Similarly, the first FF ring oscillator 68 outputs a clock FFCLK having the same frequency as that of the internal clock INCLK and an inverted clock $\overline{\text{FFCLK}}$ by using, as a trigger, a leading edge of an inverted external clock $\overline{\text{EXCLK}}$ of the external clock EXCLK.

When the inverted external clock EXCLK is at the "High" level, leading edges of the clock FFCLK and the clock $\overline{\text{FFCLK}}$ are counted (excluding those corresponding to the leading edge of the inverted external clock $\overline{\text{EXCLK}}$). In FIG. 7, the total number of the leading edges is three.

The total of the leading edges of the clocks FRCLK, $\overline{\text{FRCLK}}$, FFCLK and $\overline{\text{FFCLK}}$ is divided by 2. A value thus obtained is used to control the Coarce generating circuit 62. In FIG. 7, the current output from the current dividing circuit 61 is increased by three times by the Coarce generating circuit 62. In this case, the current of the ring oscillator 49 is increased by about three times and the frequency of the internal clock INCLK is reduced to about one third. For this reason, it is decided that the ratio of the frequency of the internal clock INCLK to that of the external clock EXCLK is 1 in the frequency comparator 41. Thus, the output of the reference current generating circuit 60 is raised and stabilized.

Figure 8:
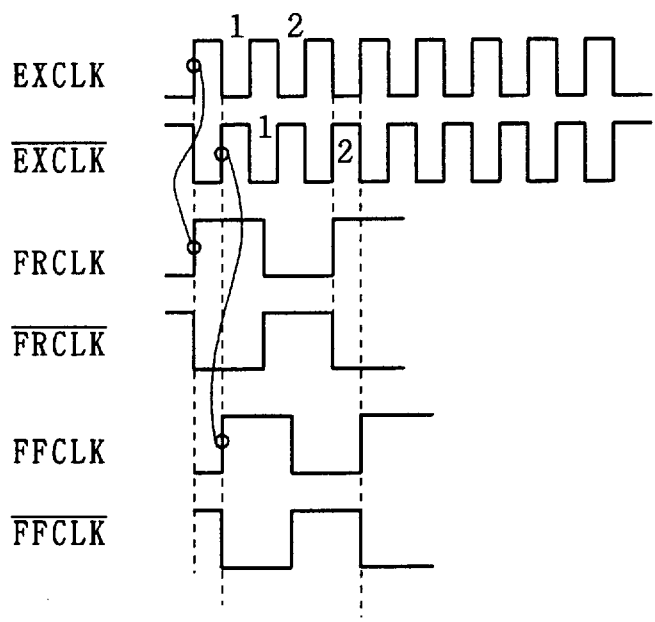

FIG. 8 is a timing chart for explaining the case where the frequency of the external clock EXCLK is higher than that of the internal clock INCLK. By using the leading edge of the external clock EXCLK as a trigger, the second FR ring oscillator 67 outputs a clock FRCLK having the same frequency as that of the internal clock INCLK and the inverted clock $\overline{\text{FRCLK}}$.

The leading edges of the external clock EXCLK obtained when the clock FRCLK is at the "Hlgh" level and those of the inverted external clock $\overline{\text{EXCLK}}$ obtained when the inverted clock $\overline{\text{FRCLK}}$ is at the "High" level are counted (excluding first leading edges, respectively). In FIG. 8, the total number of the leading edges is two.

Similarly, the second FF ring oscillator 69 outputs a clock FFCLK having The same frequency as that of the internal clock INCLK and an inverted clock $\overline{\text{FFCLK}}$ by using, as a trigger, the leading edge of the inverted external clock $\overline{\text{EXCLK}}$ of the external clock EXCLK The leading edges of the inverted external clock $\overline{\text{EXCLK}}$ obtained when the clock FFCLK is at the "High" level and those of the inverted external clock bar EXCLK obtained when the inverted clock $\overline{\text{FFCLK}}$ is at the "High" level are counted. In FIG. 8, the total number of the leading edges is two.

The total of the leading edges of the external clocks EXCLK and $\overline{\text{EXCLK}}$ is divided by 2. A value thus obtained is used to control the Coarce generating circuit 62. In FIG. 8, the current output from the current dividing circuit 61 is reduced to a half by the Coarce generating circuit 62. In this case, the current of the ring oscillator 49 is reduced to about a half and the frequency of the internal clock INCLK is almost doubled. For this reason, it is decided that the ratio of the frequency of the internal clock INCLK to that of the external clock EXCLK is 1 in the frequency comparator 41. Thus, the output of the reference current generating circuit 60 is dropped and stabilized.

In the frequency comparator 41 described above, one of the frequencies of the external clock EXCLK and the internal clock INCLK which is greater is divided by the other and a value calculated by the division is obtained as an integer. Thus, the ratio of the two frequencies ranges from ½ to 2 by the operation of the first current output means 50.

Figure 6:
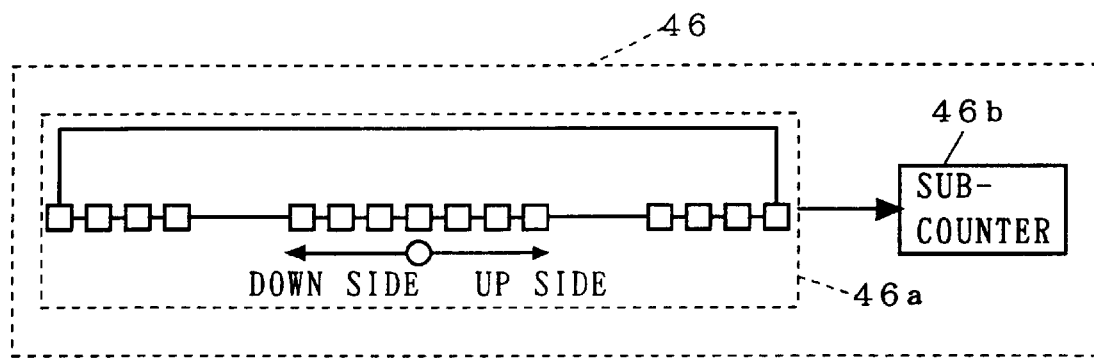
FIG. 6 is a block diagram showing a structure of a comparison result measuring circuit in FIG. 4.

As shown in FIG. 6, the comparison result measuring circuit 46 is provided with a bidirectional shift ring 46a formed by connection of a plurality of bi-directional shift registers like a ring, and a subcounter 46b. The bi-directional shift ring 46a shifts data to a next shift register in response to a clock output from the phase detecting shifter 70. Accordingly, a shift speed is increased if the frequency of the internal clock INCLK becomes higher, and is decreased if the frequency becomes lower. Thus, the bi-directional comparison result measuring circuit 46 can set a constant resolution and keep high precision by changing the shift speed even if the frequency of the internal clock INCLK becomes higher. The precision of the bidirectional shift ring 46a also depends on the number of stages forming the same.

The subcounter 46b increases a count number if it is positioned on an up side of the bidirectional shift ring 46a, and decreases the count number if it is positioned on a down side of the bi-directional shift ring 46a. The count number is given to the subcounter corresponding circuit 64. The subcounter corresponding circuit 64 increases or decreases a current to be sent to the adding circuit 65 according to the count number. The current to be sent to the Fine generating circuit 63 is greatly varied depending on the operation of the Coarce generating circuit 62, and the current to be increased or decreased by the Fine generating circuit 63 corresponding to one stage of the bidirectional shift ring 46a is set greater than the current to be increased or decreased by the subcounter corresponding circuit 64 corresponding to one count of the subcounter 46b. By this setting, the current to be sent to the ring oscillator 49 can be regulated more finely.

While the case where the phase comparator 45 has such a structure as to detect only a phase difference has been described above, a conventional phase comparator can also be used. In this case, a frequency difference is detected at the same time. However, the frequency difference is set to a half to a double by a loop including the frequency comparator 41. Therefore, the phase comparator mainly detects the phase difference.

According to the PLL circuit 40 having the abovementioned structure, also in the case where the conventional frequency phase comparator 30 is used in place of the phase comparator 45, the external clock EXCLK and the internal clock INCLK can ideally be synchronized with each other for about 2 clocks on long cycle sides thereof even if the frequency difference and the phase difference are great.

While the current dividing circuit 61 is provided to divide a current and the divided currents are processed by the Coarce generating circuit 62, the Fine generating circuit 63 and the subcounter corresponding circuit 64 respectively and are added together by the adding circuit 65 in the abovementioned embodiment, another structure can be used. For example, the subcounter corresponding circuit 64, the Fine generating circuit 63 and the Coarce generating circuit 62 may be connected in series in this order, and the current output from the reference current generating circuit 60 is serially increased or decreased and then sent to the ring oscillator. Thus, the same effects as in the above-mentioned embodiment can be obtained.

Third Embodiment

Figure 9:
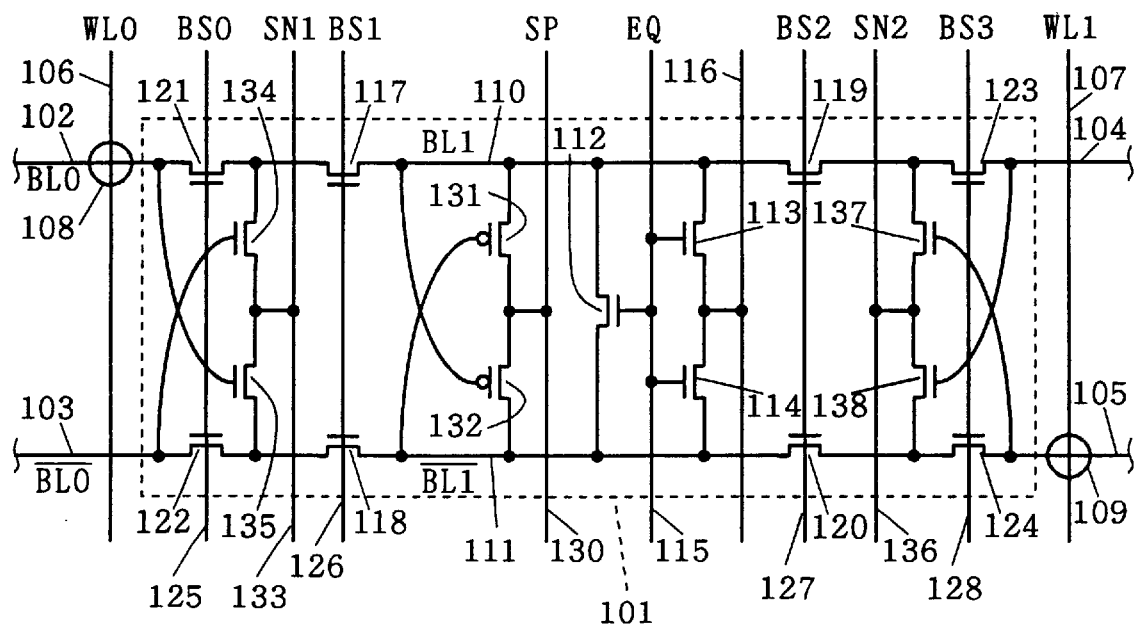
FIG. 9 is a circuit diagram showing a structure of a semiconductor integrated circuit according to a third embodiment of the present invention.

A DRAM sense amplifier according to a third embodiment of the present invention will be described below. FIG. 9 is a circuit diagram showing a structure of the DRAM sense amplifier according to the third embodiment of the present invention. As shown in FIG. 9, a sense amplifier 101 has a pair of bit lines 102 and 103 provided on one of sides thereof, and a pair of bit lines 104 and 105 provided on the other side thereof. The bit lines 102 and 103 are connected to a left side of the sense amplifier 101. BLO and $\overline{BLO}$ denote signals read or written from or to the bit lines 102 and 103, respectively. Word lines 106 and 107 are provided orthogonally to the bit lines 102 and 103 and the bit lines 104 and 105, respectively. WLO and WL1 denote signals sent through the word lines 106 and 107, respectively.

If the signals WLO and WL1 of the word lines 106 and 107 are at "High" level (hereinafter referred to as "H"), a memory cell 108 is connected to the bit line 102 and a memory cell 109 is connected to the bit line 105, for example. Consequently, the pair of bit lines 102 and 103 and the pair of bit lines 104 and 105 can transfer data of the memory cells 108 and 109 to the sense amplifier 101, respectively.

The sense amplifier 101 has a bit line 110 provided on an extension line of the bit lines 102 and 104, and has a bit line 111 provided on an extension line of the bit lines 103 and 105. BL1 and $\overline{BL1}$ denote signals of the bit lines 110 and 111, respectively. An NMOS transistor 112 has a gate connected to a signal line 115 and two current electrodes connected to the bit lines 110 and 111, respectively. The signal line 115 is also connected to gates of NMOS transistors 113 and 114. The NMOS transistor 113 has two current electrodes connected to a power line 116 and the bit line 110, respectively. The NMOS transistor 114 has two current electrodes connected to the power line 116 and the bit line 111, respectively. If an equalize signal EQ sent to the signal line 115 is set to "H", the NMOS transistors 112 to 114 are turned on so that an intermediate voltage (which takes Vcc/2 if a power-supply voltage is Vcc) is supplied from the power line 116 to the bit lines 110 and 111.

NMOS transistors 117 and 121 are isolation transistors which are connected between the bit lines 102 and 110 in series, and performs connection and disconnection of the bit lines 102 and 110. NMOS transistors 118 and 122 are isolation transistors which are connected between the bit lines 103 and 111 in series, and performs connection and disconnection of the bit lines 103 and 111.

NMOS transistors 119 and 123 are isolation transistors which are connected between the bit lines 104 and 110 in series, and performs connection and disconnection of the bit lines 104 and 110. NMOS transistors 120 and 124 are isolation transistors which are connected between the bit lines 105 and 111 in series, and performs connection and disconnection of the bit lines 105 and 111.

Gates of the NMOS transistors 117 and 118 are connected to a signal line 126, and are conducted when a signal BS1 sent through the signal line 126 is "H". Gates of the NMOS transistors 121 and 122 are connected to a signal line 125 and are conducted when a signal BSO sent through the signal line 125 is "H". Gates of the NMOS transistors 119 and 120 are connected to a signal line 127 and are conducted when a signal BS2 sent through the signal line 127 is "H". Gates of the NMOS transistors 123 and 124 are connected to a signal line 128 and are conducted when a signal BS3 sent through the signal line 128 is "H".

A power line 130 is connected to the bit lines 110 and 111 through PMOS transistors 131 and 132, respectively. A voltage of the power line 130 is indicated at SP. Threshold voltages of the PMOS transistors 131 and 132 are set lower than Vcc/2. A gate of the PMOS transistor 131 connected between the power line 130 and the bit line 110 is connected to the bit line 111, and a gate of the PMOS transistor 132 connected between the power line 130 and the bit line 111 is connected to the bit line 110. The power line 130 is provided with switching means such as a transistor for connection or disconnection to or from a power supply for supplying a power-supply voltage Vcc, which is not shown.

A power line 133 is connected to a connection point of the NMOS transistors 117 and 121 through an NMOS transistor 134, and is connected to a connection point of the NMOS transistors 118 and 122 through an NMOS transistor 135. A voltage of the power line 133 is indicated at SN1. The NMOS transistors 134 and 135 have threshold values which are lower than the intermediate voltage Vcc/2. A gate of the NMOS transistor 134 connected between the power line 133 and the NMOS transistors 117 and 121 is connected to the bit line 103. A gate of the NMOS transistor 135 connected between the power line 133 and the NMOS transistors 118 and 122 is connected to the bit line 102. The power line 133 is provided with switching means such as a transistor for connection or disconnection to or from a power supply for supplying a power-supply voltage GND, which is not shown.

A power line 136 is connected to a connection point of the NMOS transistors 119 and 123 through an NMOS transistor 137, and is connected to a connection point of the NMOS transistors 120 and 124 through an NMOS transistor 138. A voltage of the power line 136 is indicated at SN2. Threshold voltages of the NMOS transistors 137 and 138 can be set greater than the intermediate voltage Vcc/2. A gate of the NMOS transistor 137 connected between the power line 136 and the NMOS transistors 119 and 123 is connected to the bit line 105. A gate of the NMOS transistor 138 connected between the power line 136 and the bit line 111 is connected to the bit line 104. The power line 136 is provided with switching means such as a transistor for connection or disconnection to or from a power supply for supplying a power-supply voltage GND, which is not shown.

Figure 10:
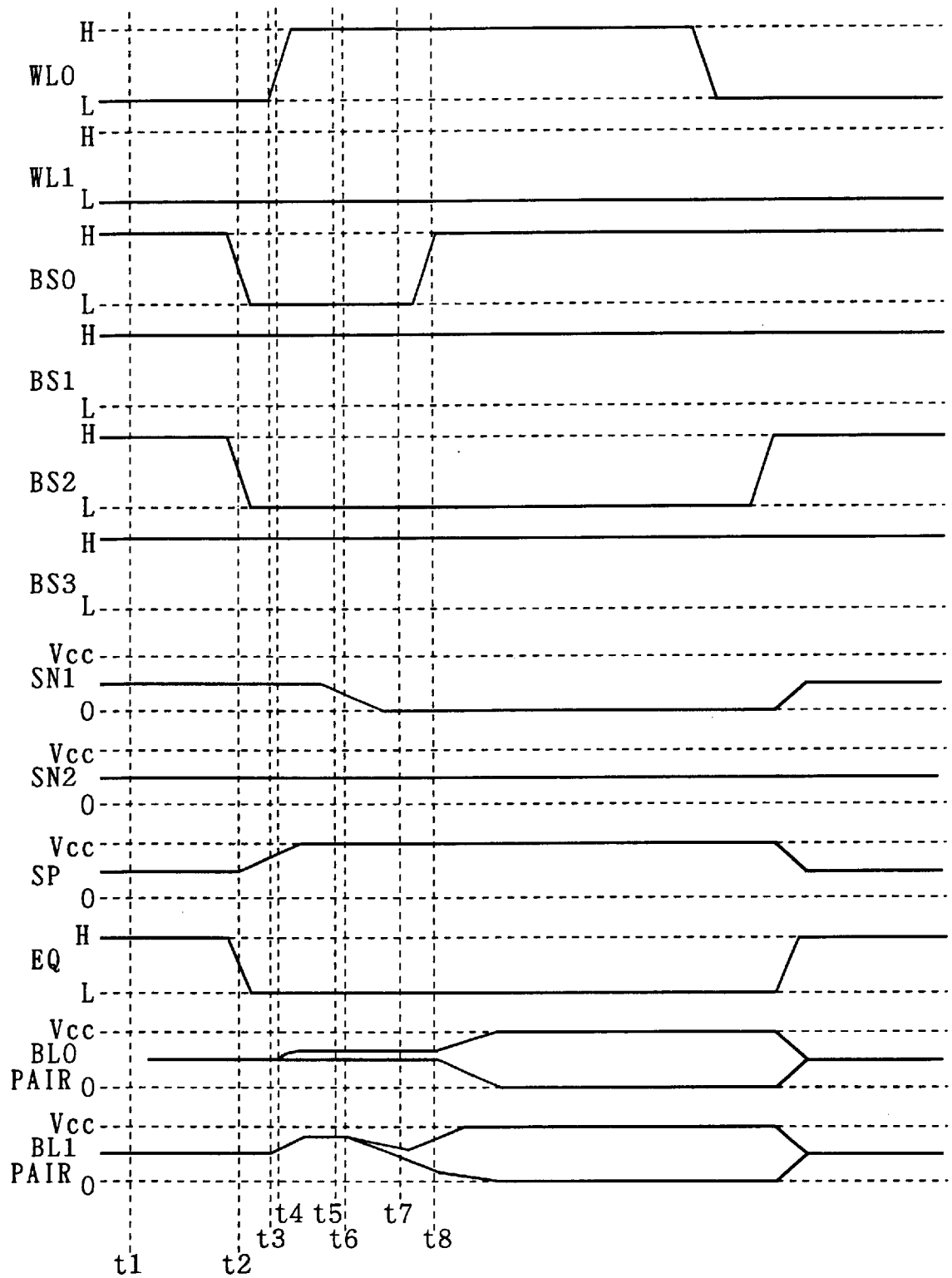
FIG. 10 is a timing chart for explaining operation of the circuit in FIG. 9.

Operation of the sense amplifier 101 will be described below with reference to a timing chart of FIG. 10.

At a time t1, the signals WL0 and WL1 are at "Low" level (hereinafter referred to as "L"), and the memory cells 108 and 109 are not connected to the bit lines 102 and 105. At this time, the signals BS0 to BS3 are "H", and the bit lines 102, 104 and 110 are connected to one another and the bit lines 103, 105 and 111 are connected to one another. Furthermore, since the equalize signal EQ is "H", the NMOS transistors 112 to 114 are conducted so that all the bit lines 102 to 105, 110 and 111 are charged to the intermediate voltage on receipt of electric charges supplied from the power line 116. At this time, all the power lines 130, 133 and 136 are cut off from a power supply. Therefore, the voltages SP, SN1 and SN2 of these lines are set to the intermediate voltage.

At a time t2, the equalize signal EQ is set to "L" and the NMOS transistors 112 to 114 are turned off so that the bit lines 110 and 111 are cut off from the power line 116. At the time t2, the signals BS0 and BS2 are also set to "L" and the NMOS transistors 119 to 122 are turned off. Therefore, the bit lines 102, 104 and 110 are cut off from one another and the bit lines 103, 105 and 111 are cut off from one another. Accordingly, the bit lines 110 and 111 are separately brought into a floating state by the operation performed at the time t2.

Immediately after the time t2, the power line 130 is connected to the power supply so that the voltage SP starts to be raised toward Vcc. The electric charges are not supplied to the bit lines 110 and 111. Therefore, the voltage SP and a potential difference between the bit lines 110 and 111 exceed the threshold voltages of the PMOS transistors 131 and 132 at a time t3. Consequently, the PMOS transistors 131 and 132 are turned on so that the signals BL1 and $\overline{BL1}$ start to be raised toward the power-supply voltage Vcc following the voltage SP.

At a time t4, when the signal WL0 is set to "H", the memory cell 108 is connected to the bit line 102 so that a potential difference is made between the bit lines 102 and 103. The potential difference is very small as compared with the power-supply voltage Vcc and the ground voltage GND, which will be referred to as an initial amplitude. Since the bit lines 102 and 103 are cut off from the bit lines 110 and 111 respectively, they hold the initial amplitude.

At a time t5, the voltages of the bit lines 110 and 111 are stabilized at voltages which are lower than the power-supply voltage Vcc by the threshold voltages of the PMOS transistors 131 and 132. At this time, the power line 133 is connected to a power supply GND to gradually drop the voltage.

At a time t6, a potential difference between the bit lines 102 and 103 and the power line 133 reaches the threshold voltages of the NMOS transistors 134 and 135 so that the NMOS transistors 134 and 135 are turned on and the voltages of the bit lines 110 and 111 start to be dropped. However, the on state of the NMOS transistor 135 is stronger than that of the NMOS transistor 134 due to the initial amplitude. Therefore, an amount of a current flowing to the NMOS transistor 135 is larger than that of a current flowing to the NMOS transistor 134. Consequently, the voltage of the bit line 111 is lowered more quickly than that of the bit line 110.

At a time t7, when a voltage between the bit line 111 and the power line 130 reaches the threshold voltage of the PMOS transistor 131, the PMOS transistor 131 is turned on so that the voltage of the bit line 110 starts to be raised toward the power-supply voltage Vcc on receipt of electric charges supplied from the power line 130. At this time, the voltage of the bit line 110 is dropped by only the NMOS transistor 134.

At a time t8, when a potential difference between the bit lines 110 and 111 becomes sufficiently great, the signal BS0 is set to "H" so that the pair of bit lines 102 and 103 are connected to the pair of bit lines 110 and 111, respectively. When the NMOS transistors 121 and 122 are turned on, the NMOS transistors 134 and 135 act as latches so that amplitudes of the bit lines 102 and 103 and the bit lines 110 and 111 can be caused to fully swing between the power-supply voltages Vcc and GND.

As described above, the NMOS transistors 134 and 135 are used as a part of amplifying means and as the latches at the same time. Therefore, the structure of the sense amplifier 101 is simplified.

While a relationship between the sense amplifier 101 and the bit lines 102 and 103 on the left side has been described in the above-mentioned embodiments the sense amplifier 101 and the bit lines 104 and 105 on the right side have the same relationship because the sense amplifier 101 and the bit lines 102 to 105 are bilaterally symmetrical.

Fourth Embodiment

Figure 11:
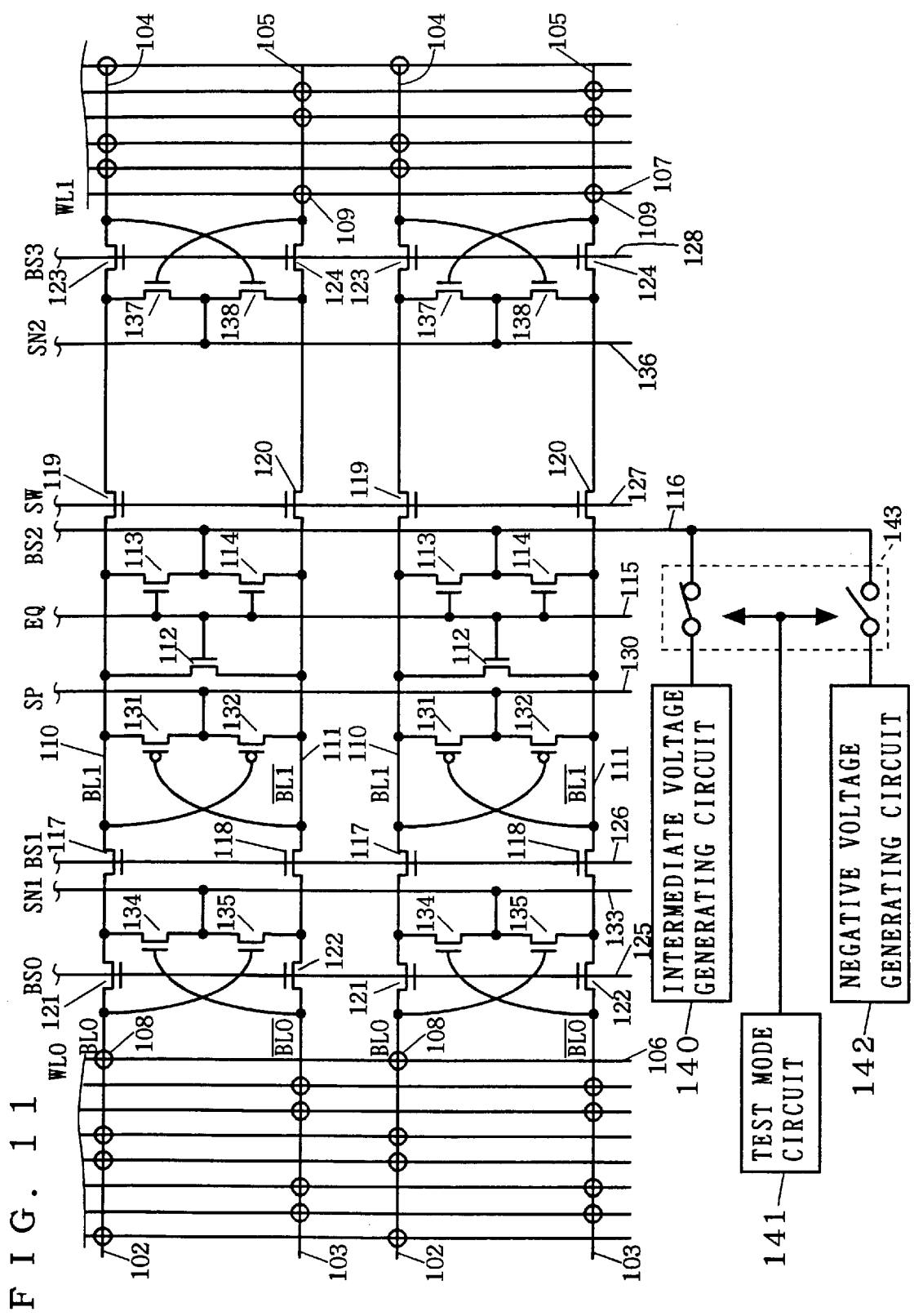
FIG. 11 is a circuit diagram showing a structure of a semiconductor integrated circuit according to a fourth embodiment of the present invention.

A semiconductor integrated circuit according to a fourth embodiment of the present invention will be described below with reference to the drawings. FIG. 11 is a circuit diagram showing an example of a structure of a DRAM according to the fourth embodiment of the present invention. In FIG. 11, the same reference numerals as in FIG. 9 correspond to the same portions as in FIG. 9. An intermediate voltage generating circuit 140 usually supplies, to a power line 116, an intermediate voltage VBL which is about a half of a power-supply voltage Vcc.

A negative voltage generating circuit 142 is provided to write "L" to memory cells in a batch so as to perform a test. The negative voltage generating circuit 142 is connected to the power line 116 in place of the intermediate voltage generating circuit 140 by switching means 143 in response to a command sent from a test mode circuit 141.

Figure 12:
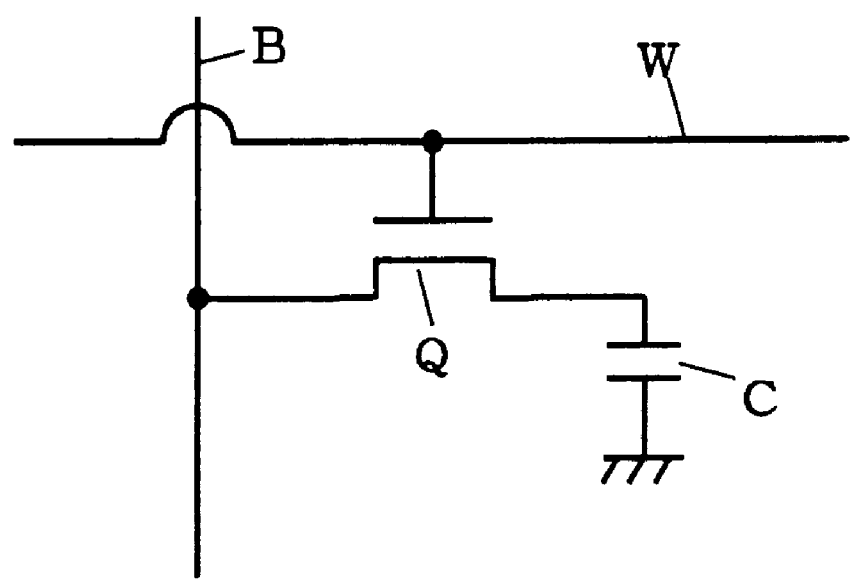
FIG. 12 is a circuit diagram showing an example of a structure of a memory cell according to the fourth embodiment of the present invention.

The negative voltage generating circuit 142 gives a negative voltage which is lower than "Low" level of an equalize signal EQ and signals BS0 to BS3 by a threshold value of an NMOS transistor. Consequently, transistors 113 and 114 and transistors 117 to 124 are successively turned on so that voltages of bit lines 103 to 105 are set negative. At this time, even if "L" is given to word lines 106 and 107 and the like to bring a gate transistor of the memory cell into an off state, "L" can be written as data to the memory cell. For example, in one transistor one capacitor type memory cell shown in FIG. 12, a transistor Q is turned on depending on a potential difference between a bit line B and a word line W. Therefore, data can be written to a capacitor C.

While the writing is being performed, power lines 130, 133 and 136 are in a floating state.

Figure 13:
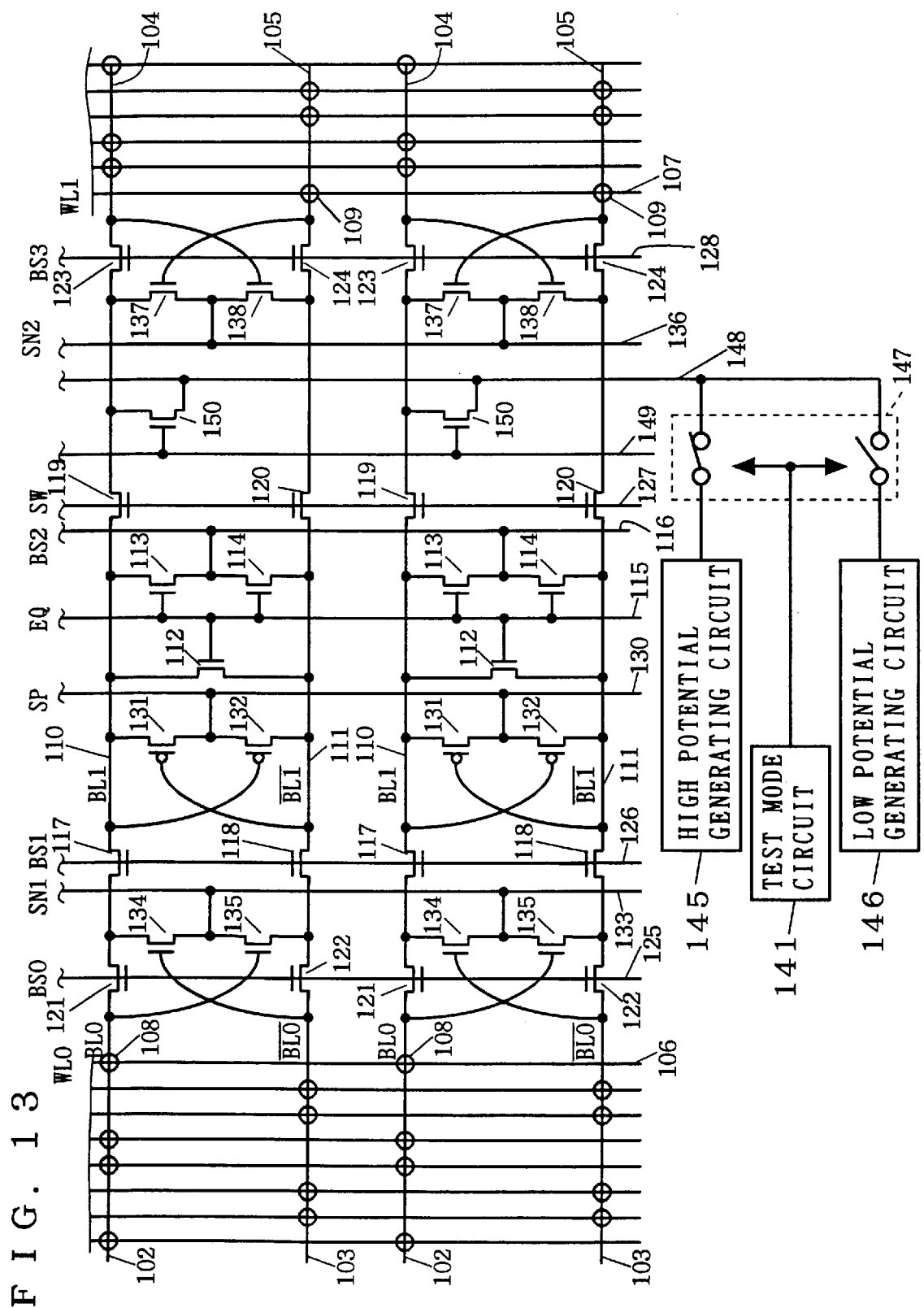
FIG. 13 is a circuit diagram showing another example of the structure of the semiconductor integrated circuit according to the fourth embodiment of the present invention.

FIG. 13 is a circuit diagram showing a second example of the structure of the DRAM according to the fourth embodiment of the present invention. In FIG. 13, the same reference numerals as in FIG. 9 correspond to the same portions as in FIG. 9. A high potential generating circuit 145 is connected to a power line 148 by switching means 147 and serves to set the power line 148 to a potential higher than a precharge potential. A low potential generating circuit 146 is connected to the power line 148 by the switching means 147 and serves to set the power line 148 to a potential lower than the precharge potential. The precharge potential means a potential of each of precharged bit lines 110 and 111. The high potential means a potential which is higher than the precharge potential by a threshold value of an NMOS transistor. The low potential means a potential which is lower than the precharge potential by the threshold value of the NMOS transistor.

The test mode circuit 141 controls the switching means 147 in a test mode and connects the high potential generating circuit 145 or the low potential generating circuit 146 to the power line 148. In modes other than the test mode, neither the high potential generating circuit 145 nor the low potential generating circuit 146 is connected to the power line 148. Provided is an NMOS transistor 150 having one of current electrodes connected to the power line 148, the other current electrode connected to the bit line 110, and a gate connected to a signal line 149.

The signal line 149 is at "High" level in the test mode. When the power line 148 is set to a high or low potential, the bit line 110 is charged to a high or low potential. Then, if data is written to an intended word line, they can be written to memory cells in a batch. A ground voltage GND is given to the signal line 149 in the modes other than the test mode.

Figure 14:
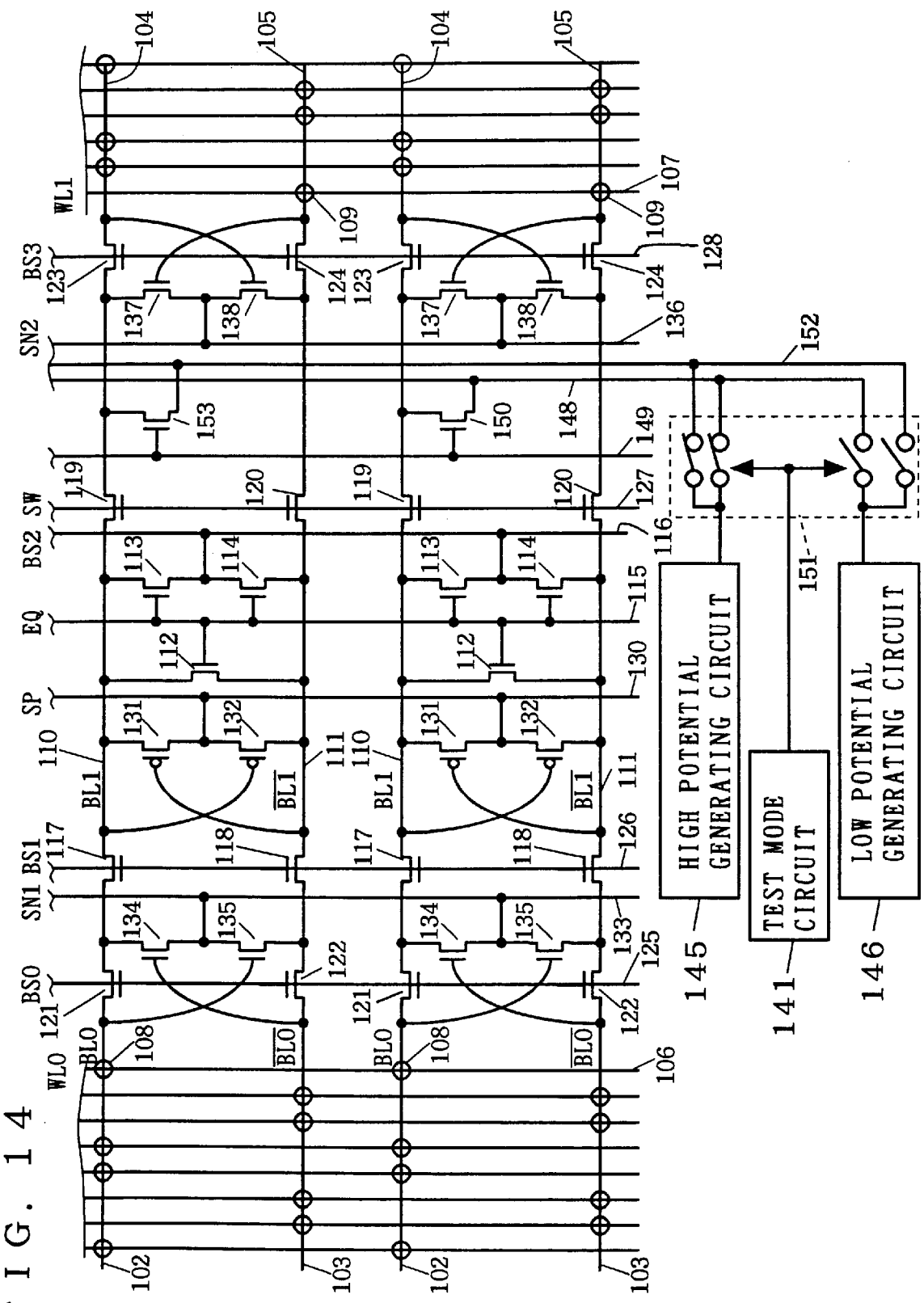
FIG. 14 is a circuit diagram showing a further example of the structure of the semiconductor integrated circuit according to the fourth embodiment of the present invention.
Figure 15:
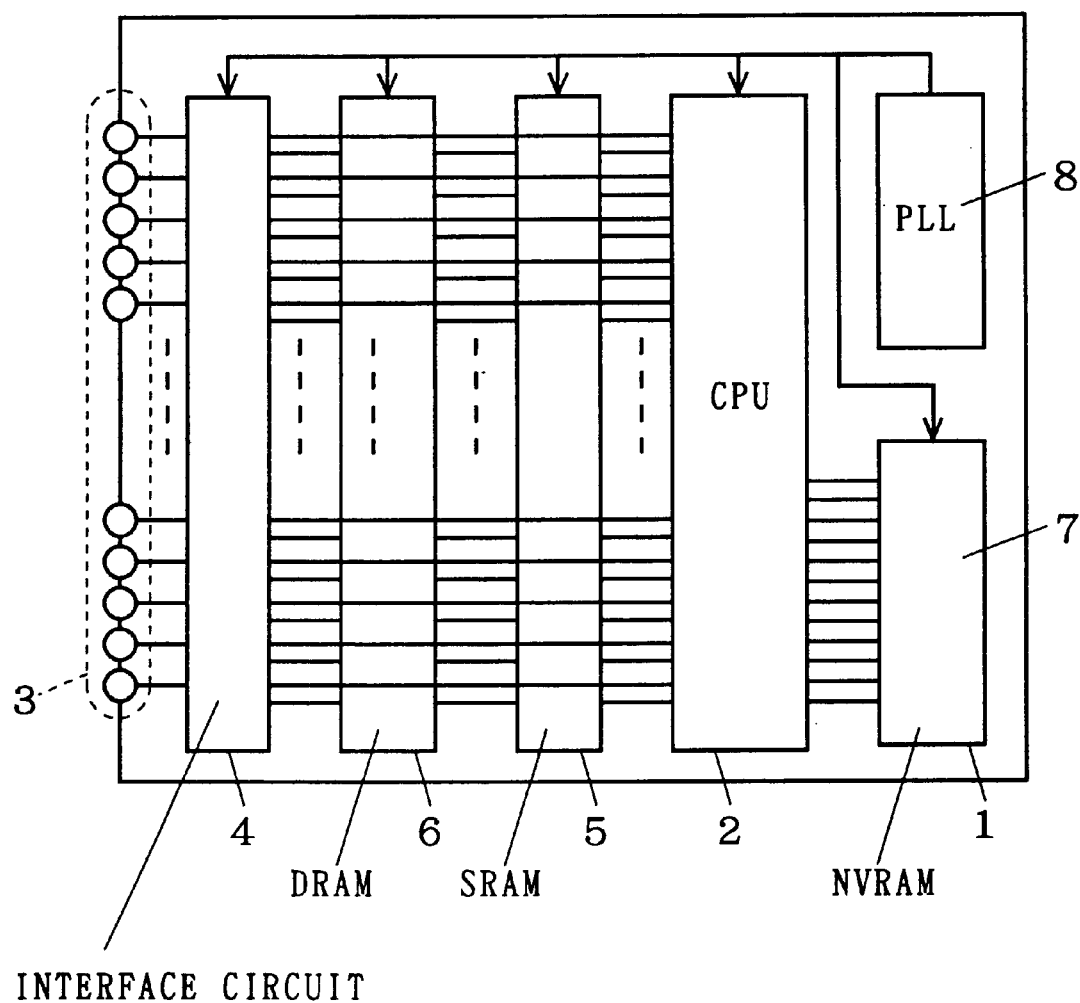
FIG. 15 is a block diagram showing a general structure of the semiconductor integrated circuit.
Figure 16:
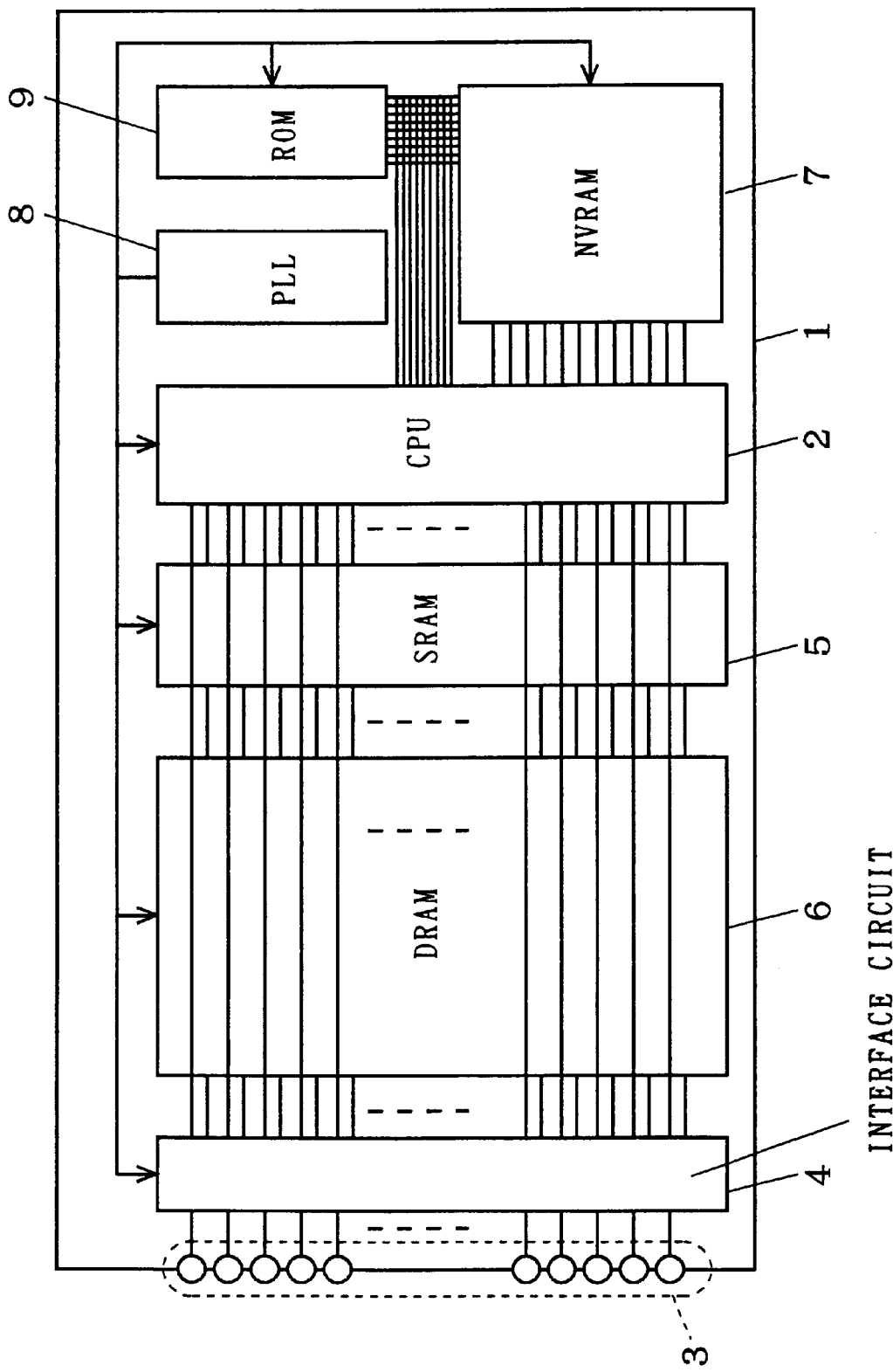
FIG. 16 is a block diagram showing a structure of an expand version of the semiconductor integrated circuit.
Figure 17:
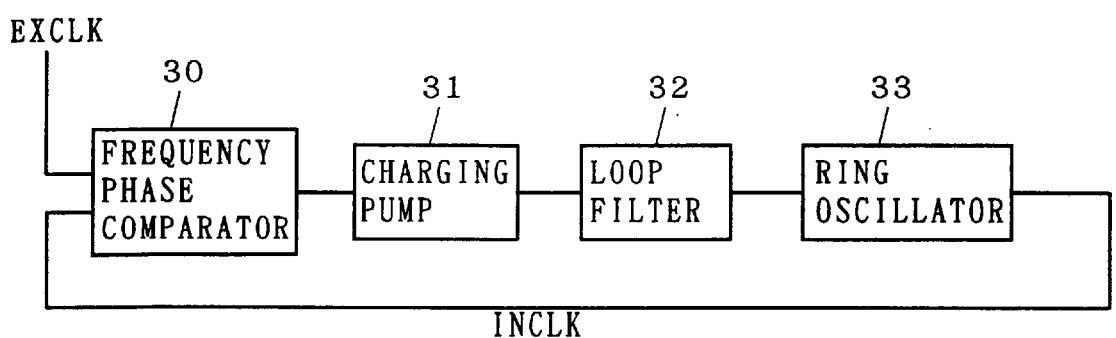
FIG. 17 is a block diagram showing a structure of a PLL circuit according to the prior art.

FIG. 14 is a circuit diagram showing a third example of the structure of the DRAM according to the fourth embodiment of the present invention. In FIG. 14, the same reference numerals as in FIG. 13 correspond to the same portions as in FIG. 13. The DRAM according to the third example is different from the DRAM according to the second example in that a power line 152 is provided in addition to a power line 148 and rows of bit lines connected to a high potential generating circuit 145 or a low potential generating circuit 146 are divided into even columns and odd columns. The power line 148 is connected to the bit lines of the odd columns through a transistor 150 and the power line 152 is connected to the bit lines of the even columns through a transistor 153. Switching means 151 is formed to select the power lines 148 and 152.

While the invention has been described in detail, the foregoing description is in all aspects illustrative and not restrictive. It is understood that numerous other modifications and variations can be devised without departing from the scope of the invention.

I claim:

1. A semiconductor integrated circuit comprising:
    a first word line;
    first and second bit lines which are paired with each other, at least one of which is selectively connected to a memory cell by said first word line;
    third and fourth bit lines provided corresponding to said first and second bit lines respectively and paired with each other;
    a first transistor connected between said first and third bit lines in series and on-off controlled in response to a first signal sent to a control electrode;
    a second transistor connected between said second and fourth bit lines in series and on-off controlled in response to said first signal sent to a control electrode;
    first and second power lines capable of supplying a first voltage and a second voltage different from said first voltage, and of being cut off from a power supply to be brought into a floating state;
    a third power line for supplying a third voltage between said first and second voltages;
    switching means for connecting said third power line to said third and fourth bit lines in response to an equalize signal;
    a third transistor having a first current electrode connected to said first power line, a second current electrode connected to said third bit line, and a control electrode connected to said fourth bit line;
    a fourth transistor having a first current electrode connected to said first power line, a second current electrode connected to said fourth bit line, and a control electrode connected to said third bit line;
    a fifth transistor having a first current electrode connected to said second power line, a second current electrode connected to said second current electrode of said third transistor, and a control electrode connected to said second bit line; and
    a sixth transistor having a first current electrode connected to said second power line, a second current electrode connected to said second current electrode of said fourth transistor, and a control electrode connected to said first bit line.

2. The semiconductor integrated circuit as defined in claim 1, further comprising:
    a second word line;
    fifth and sixth bit lines provided opposite side of said third and fourth bit lines to said first and second bit lines, and paired with each other, at least one of which is selectively connected to said memory cell by said second word line;
    a seventh transistor having a first current electrode and a second current electrode for being connected between said fifth and third bit lines in series and a control electrode to which said second signal is sent, said seventh transistor being on-off controlled in response to said second signal;
    an eighth transistor having a first current electrode and a second current electrode for being connected between said sixth and fourth bit lines in series and a control electrode to which said second signal is sent, said eighth transistor being on-off controlled in response to said second signal;
    a fourth power line capable of supplying said first and second voltages and of being cut off from a power supply to be brought into a floating state;
    a ninth transistor having a first current electrode connected to said fourth power line, a second current electrode connected to said second current electrode of said seventh transistor, and a control electrode connected to said sixth bit line; and
    a tenth transistor having a first current electrode connected to said fourth power line, a second current electrode connected to said second current electrode of said eighth transistor, and a control electrode connected to said fifth bit line.

3. A semiconductor integrated circuit comprising:
    a first transistor having a first current electrode connected to storage nodes of memory cells, a second current electrode and a control electrode, said first transistor being conducted when said control electrode is at "High" level and being non-conducted when said control electrode is at "Low" level;

a word line connected to said control electrode of said first transistor;

a first bit line connected to said second current electrode of said first transistor;

a second bit line provided corresponding to said first bit line;

a second transistor having a first current electrode connected to said first bit line, a second current electrode connected to said second bit line and a control electrode to which a first signal is sent, said second transistor being conducted when said first signal is at said "High" level and being non-onducted when said first signal is at said "Low" level;

a power line;

a third transistor having a first current electrode connected to said power line, a second current electrode connected to said second bit line and a control electrode to which a second signal is sent, said third transistor being conducted when said second signal is at said "High" level and being non-conducted when said second signal is at said "Low" level; and a specific voltage generating circuit capable of being selectively connected to said power line and supplying, to said power line, a specific voltage which can cause said power line to have a voltage lower than said "Low" level and make said first to third transistors conducted irrespective of a voltage of said word line and potentials of said first and second bit lines.

4. The semiconductor integrated circuit as defined in claim 3, wherein said power line supplies an intermediate voltage to said first and second bit lines when said specific voltage is not supplied.

5. A semiconductor integrated circuit comprising:

a first word line and a first bit line connected to a first memory cell;

a second bit line provided corresponding to said first bit line;

a first transistor having a first current electrode connected to said first bit line, a second current electrode connected to said second bit line, and a control electrode to which a first signal is sent, said first transistor being conducted when said first signal has a first potential and being non-conducted when said first signal has a second potential;

a second transistor having a first current electrode connected to said second bit line, a second current electrode and a control electrode to which a second signal is sent;

a power line connected to said second current electrode of said second transistor; and a potential generating circuit capable of being selectively connected to said power line and giving, to said power line, a potential different from an intermediate potential between said first and second potentials by a value greater than a threshold value of said second transistor when said second bit line is cut off from said first bit line by said first transistor so that said second bit line and said second signal have said intermediate potential.

6. The semiconductor integrated circuit as defined in claim 5, wherein said potential generating circuit includes a high potential generating circuit for generating a potential higher than said intermediate potential.

7. The semiconductor integrated circuit as defined in claim 5, wherein said potential generating circuit includes a low potential generating circuit for generating a potential lower than said intermediate potential.

8. The semiconductor integrated circuit as defined in claim 5, further comprising a third bit line which is connected to a second memory cell connected to said second word line and is not connected to said second transistor, said second memory cell being different from said first memory cell.

9. A semiconductor memory device, comprising:

an equalize power line;

a plurality of bit lines for forming a plurality of pairs of bit lines;

a memory cell provided corresponding to each of said plurality of bit lines;

a plurality of equalize circuits provided corresponding to each of said plurality of pairs of bit lines, said plurality of equalize circuits being configured to cause a short-circuit between said plurality of pairs of bit lines with said equalize power line in response to an equalize signal;

a switching circuit configured to provide switching between a first potential as an equalize potential and a second potential different from said first potential in response to a predetermined signal and supplying alternatively said first and second potentials to said equalize power line, and a test mode circuit configured to output the predetermined signal.

10. The semiconductor memory device according to claim 9, wherein said second potential is lower than said first potential.

11. The semiconductor memory device according to claim 10, further comprising:

an intermediate potential generating circuit configured to supply said first potential; and a negative potential generating circuit configured to supply a negative potential as said second potential.

12. The semiconductor memory device according to claim 10, further comprising a plurality of detecting circuits respectively provided corresponding to said plurality of pairs of bit lines, said plurality of detecting circuits being configured to amplify and detect a potential difference between each of said plurality of pairs of bit lines, wherein a driving power supply is configured to be in a floating state when said second potential is supplied to said equalize power line.

13. A semiconductor memory device, comprising:

a plurality of bit lines for forming a plurality of pairs of bit lines;

a plurality of transistors respectively provided corresponding to said plurality of pairs of bit lines;

a memory cell provided corresponding to each of said plurality of bit lines; and at least one power line configured to selectively supply, in a test mode, a first potential and a second potential lower than said first potential to one bit line for forming each of said plurality of pairs of bit lines, wherein said plurality of transistors is configured to connect, in said test mode, said power line and said one bit line for forming each of said plurality of pairs of bit lines.

14. The semiconductor device according to claim 13, further comprising a switching circuit configured to perform switching between said first potential and said second potential and supplying alternatively said first and second potentials to said power line in said test mode.

15. The semiconductor device according to claim 14, further comprising:
   a high potential generating circuit configured to supply said first potential; and
   a low potential generating circuit configured to supply said second potential.

16. The semiconductor device according to claim 13, wherein said power line includes a plurality of power lines; and said plurality of transistors include a first transistor connected to a first power line of said plurality of power lines and a second transistor connected to a second power line of said plurality of power lines.

17. The semiconductor device according to claim 16, wherein said first transistor and said second transistor are alternatively arranged in a direction of said plurality of bit lines.

* * * * *

UNITED STATES PATENT AND TRADEMARK OFFICE
CERTIFICATE OF CORRECTION

PATENT NO.    : 6,502,145 B1
DATED         : December 31, 2002
INVENTOR(S)   : Ooishi It is certified that error appears in the above-identified patent and that said Letters Patent is hereby corrected as shown below:

<u>Title page,</u>
Item [45] and Item [*] Notice should read as follows:

-- [45] Date of Patent:  Dec. 31, 2002 --

-- [*] Notice:    Subject to any disclaimer, the term of this patent is extended or adjusted under 35 U.S.C. 154(b) by 0 days. --

Signed and Sealed this

Thirteenth Day of May, 2003

JAMES E. ROGAN
*Director of the United States Patent and Trademark Office*